(12) United States Patent
    Maurino et al.

(10) Patent No.: US 11,545,996 B1
(45) Date of Patent: Jan. 3, 2023

(54) LOW-NOISE, HIGH-ACCURACY SINGLE-ENDED INPUT STAGE FOR CONTINUOUS-TIME SIGMA DELTA (CTSD) ANALOG-TO-DIGITAL CONVERTER (ADC)

(71) Applicant: Analog Devices International Unlimited Company, Limerick (IE)

(72) Inventors: Roberto Sergio Matteo Maurino, Turin (IT); Venkata Aruna Srikanth Nittala, Bengaluru (IN); Bhargav R. Vyas, Bangalore (IN); Christopher Peter Hurrell, Cookham (GB); Andrew J. Thomas, Arlington, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/410,163

(22) Filed: Aug. 24, 2021

(51) Int. Cl.
    *H03M 3/00* (2006.01)
    *H03M 1/36* (2006.01)
    *H03M 1/12* (2006.01)
    *H03M 1/06* (2006.01)
    *H03F 3/45* (2006.01)

(52) U.S. Cl.
    CPC ........ *H03M 3/464* (2013.01); *H03F 3/45973* (2013.01); *H03M 1/0626* (2013.01); *H03M 1/1245* (2013.01); *H03M 1/363* (2013.01); *H03M 3/326* (2013.01); *H03M 3/356* (2013.01); *H03M 3/424* (2013.01); *H03M 3/454* (2013.01); *H03F 2200/331* (2013.01)

(58) Field of Classification Search
    CPC .. H03M 3/464; H03M 1/0626; H03M 1/1245; H03M 1/363; H03M 3/326; H03M 3/356; H03M 3/424; H03M 3/454; H03F 3/45973; H03F 2200/331
    USPC ...................................................... 341/142
    See application file for complete search history.

(56) References Cited

U.S. PATENT DOCUMENTS

| | | | |
|---|---|---|---|
| 7,009,541 B1 | 3/2006 | Nguyen | |
| 7,893,855 B2 * | 2/2011 | Huang | H03F 1/0277 341/143 |
| 8,059,020 B2 * | 11/2011 | Schatzberger | H03M 1/185 341/138 |
| 9,350,381 B1 * | 5/2016 | Doare | H03M 3/378 |

(Continued)

OTHER PUBLICATIONS

Nguyen et al., *A 106-dB SNR Hybrid Oversampling Analog-to-Digital Converter for Digital Audio*, IEEE Journal of Solid-State Circuits, vol. 40, No. 12, Dec. 2005, 8 pages.

(Continued)

*Primary Examiner* — Jean B Jeanglaude
(74) *Attorney, Agent, or Firm* — Akona IP PC

(57) ABSTRACT

Systems, devices, and methods related to low-noise, high-accuracy single-ended continuous-time sigma-delta (CTSD) analog-to-digital converter (ADC) are provided. An example single-ended CTSD ADC includes a pair of input nodes to receive a single-ended input signal and input circuitry. The input circuitry includes a pair of switches, each coupled to one of the pair of input nodes; and an amplifier to provide a common mode signal at a pair of first nodes, each before one of the pair of switches. The single-ended CTSD ADC further includes digital-to-analog converter (DAC) circuitry; and integrator circuitry coupled to the input circuitry and the DAC circuitry via a pair of second nodes.

20 Claims, 14 Drawing Sheets

(56) References Cited

U.S. PATENT DOCUMENTS

| | | | | |
|---|---|---|---|---|
| 9,391,628 | B1* | 7/2016 | Lyden | H03M 1/1245 |
| 9,559,719 | B1* | 1/2017 | Kauffman | H03M 3/30 |
| 10,254,776 | B1* | 4/2019 | Singleton | H03M 3/458 |
| 10,425,100 | B1* | 9/2019 | Vaturi | H03M 3/43 |
| 2006/0139192 | A1* | 6/2006 | Morrow | H03M 3/34 |
| | | | | 341/143 |
| 2011/0025537 | A1* | 2/2011 | Kim | G06G 7/186 |
| | | | | 327/344 |
| 2013/0021183 | A1* | 1/2013 | Ashburn, Jr | H03M 3/368 |
| | | | | 341/143 |
| 2015/0160266 | A1* | 6/2015 | Bogner | H03H 7/06 |
| | | | | 324/126 |
| 2017/0201270 | A1* | 7/2017 | Nittala | H03M 1/1009 |

OTHER PUBLICATIONS

Huang et al., *A Fully Differential Comparator-BasedSwitched-Capacitor ΔΣ Modulator*, IEEE Transactions on Circuits and Systems—II: Express Briefs, vol. 56, No. 5, May 2009, 5 pages.

\* cited by examiner

US 11,545,996 B1

LOW-NOISE, HIGH-ACCURACY SINGLE-ENDED INPUT STAGE FOR CONTINUOUS-TIME SIGMA DELTA (CTSD) ANALOG-TO-DIGITAL CONVERTER (ADC)

TECHNICAL FIELD OF THE DISCLOSURE

The present disclosure generally relates to electronics, and, more specifically, to low-noise, high-accuracy single-ended input stage for continuous-time sigma-delta (CTSD) analog-to-digital converter (ADC).

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense.

There are various types of ADC architectures, such as successive approximation (SAR) ADC, sigma-delta ADC, pipelined ADC, and flash ADC. Sigma-delta ADC can provide high resolution and low distortion, and thus are suitable for use in applications, such as audio, high-end data acquisition applications, precision industrial measurement applications. The high resolution is achieved by oversampling an input signal and shaping the quantization noise in the frequency band of interest into higher frequency region (e.g., outside the band of interest). The higher frequency out-of-band noise can then be digitally filtered out by subsequent digital filtering stages. The resulting data is then down-sampled to the desired sampling rate at the output of the converter. There are two different sigma-delta ADC architectures, a discrete-time based architecture and a continuous-time based architecture. In some scenarios, the continuous-time based architecture may be desirable due to its inherent anti-alias filtering characteristic, thus eliminating the need for external anti-alias filter circuitry that would otherwise be needed for the discrete-time based architecture.

CTSD ADC are commonly designed using fully differential circuits to achieve good power supply rejection ratio, immunity to on-chip couplings, clock feed-through, charge injections, even-order harmonic distortions and other second-order non-ideal effects. A fully differential circuit may include two signal paths where signals along the signal paths are equal in amplitudes but with opposite phases (opposite polarities). In some applications, an analog signal for digital conversion may be a single-ended signal rather than a fully differential signal. Accordingly, as applications for single-ended CTSD ADC grow, the need for low-noise and high-accuracy single-ended CTSD ADC also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
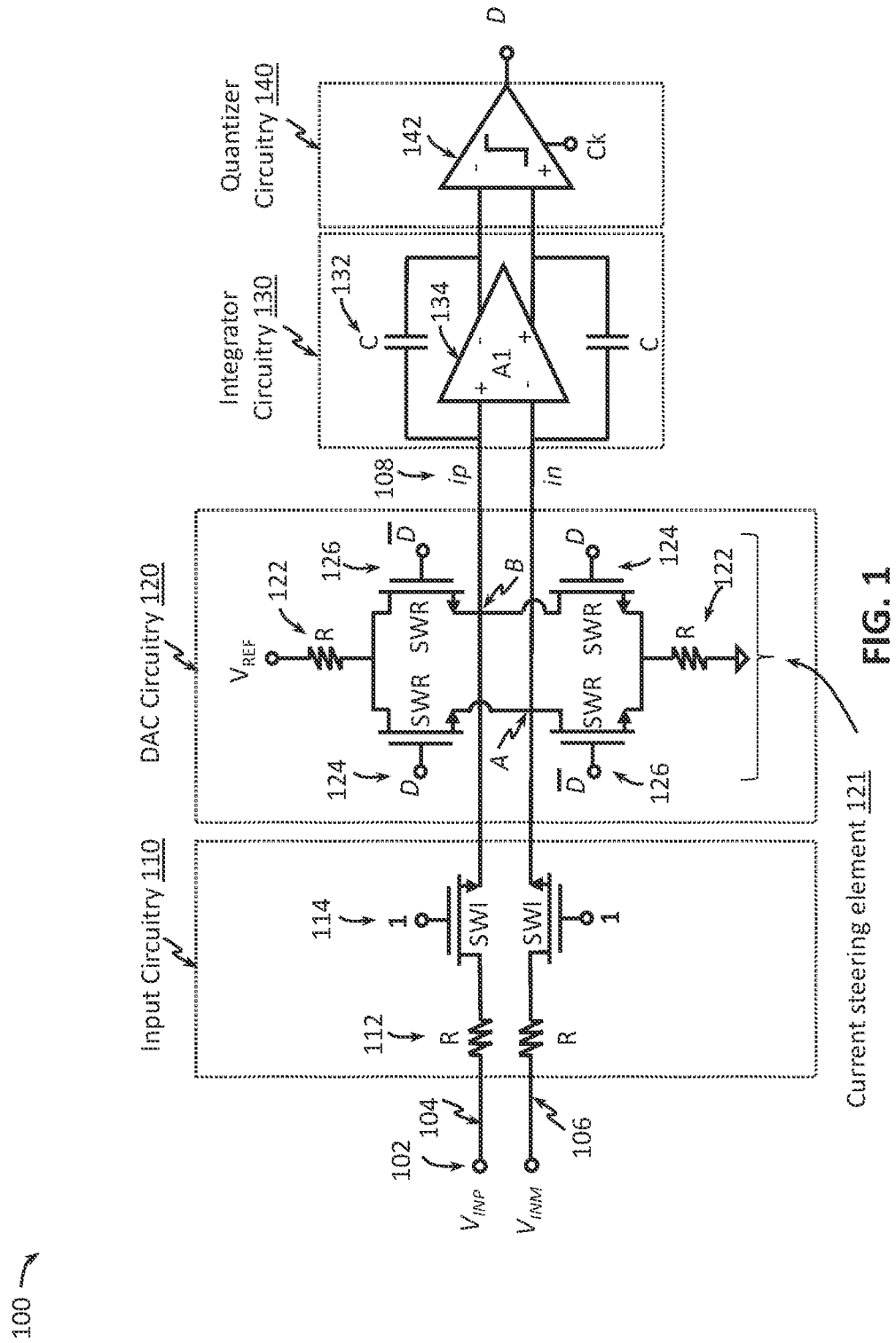
FIG. 1 is a schematic diagram illustrating an exemplary fully differential continuous-time sigma-delta (CTSD) modulator.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

For purposes of illustrating techniques for providing low-noise, high-accuracy single-ended input CTSD ADC, it may be useful to understand how CTSD ADC operates. The following foundational information may be viewed as a basis from which the present disclosure may be properly explained. Such information is offered for purposes of explanation only and, accordingly, should not be construed in any way to limit the broad scope of the present disclosure and its potential applications.

As described above, sigma-delta ADC can provide high-resolution and low-distortion via oversampling and noise shaping. The main building blocks of a sigma-delta ADC may include a sigma-delta modulator that quantizes an analog input signal into a digital signal followed by a digital filter that removes quantization noise at high frequencies from the digital output signal. Further, the digital filter may down-samples the digital output signal to a desired data rate when oversampling is used at the sigma-delta modulator. More specifically, the sigma-delta modulator is a feedback loop including a forward path with a loop filter and a quantizer and feedback path with a digital-to-analog converter (DAC). The loop filter shapes the quantization noise. The quantizer quantizes the output of the loop filter to a digital codeword. The feedback DAC converts the quantized output to an analog signal that is fed back to the input of the loop filter where the feedback signal is subtracted from the input signal prior to filtering by the loop filter.

A CTSD modulator may utilize a continuous-time integrator for the loop filter and a current steering DAC for the feedback DAC. A current steering DAC may include one or more current steering elements connected to a reference voltage and a ground potential. Each current steering element may include resistors and switches that are operated (e.g., open or close) based on the quantizer output. A fully differential CTSD modulator may include an input stage that receives a fully differential input analog signal. The input stage may include resistors to convert an input voltage signal into a current signal. To achieve a good direct current (DC) accuracy, the resistance of the input stage may be matched to the resistance of the current steering DAC so that current flowing from the input stage and current flowing from the DAC are balanced under an ideal operating condition. In this regard, the input resistors in the input stage may match the resistors in the current steering DAC. Since the switches in the DAC may generate certain resistances, for example, while the switch is on, the input stage may include replica switches to match the switches in the current steering DAC. Because the use of the replica switches is to match the resistance in the current steering DAC, the replica switches are through switches that are always-on. In some implementations, an integrated CTSD ADC may utilize complementary metal-oxide-semiconductor (CMOS) devices for the switches in the DAC circuitry and in the input circuitry. CMOS devices can cause harmonic distortion, which may be caused by the nonlinear quadratic relationship between the drain current and the drain to source voltage of CMOS devices. However, because a fully differential CTSD modulator operates on a fully differential signal (with two inputs of equal amplitudes and opposite phases or polarities), the nonlinear quadratic error from the differential paths cancels each other and thus the output of the differential CTSD modulator may be free of the nonlinear quadratic error.

As described above, in some applications, an analog signal for digital conversion may be a single-ended signal rather than a fully differential signal. In some implementations, external circuitries may be used to convert the single-ended input signal into a fully differential signal prior to conversion by a fully differential CTSD ADC (e.g., an integrated ADC device). The use of external circuitries can increase cost, area, and/or power consumption. Accordingly, it may be desirable to provide a CTSD ADC device that operates on single-ended signals to eliminate the need for the external single-ended-to-differential conversion circuitries.

To support a single-ended input, the internal input stage of a single-ended CTSD ADC device may include a common-mode operational amplifier to inject a common mode current into the input circuitry so that the single-ended input is converted into a differential signal prior to processing by the CTSD modulator. By having the CTSD modulator processes differential signals, the CTSD modulator can benefit from the cancellation of the nonlinear quadratic error caused by CMOS switches. However, the placement of the common-mode operational amplifier in the input circuitry can impact non-linearity in the single-ended CTSD ADC device.

The present disclosure describes mechanisms for providing a low-noise, high-accuracy input stage for a single-ended CTSD ADC by arranging a common-mode amplifier in the input stage such that switches in the input stage may operate on differential signals. For example, a single-ended CTSD ADC may include a pair of single-ended input nodes to receive a single-ended analog input signal. The CTSD ADC may include input circuitry to convert the single-ended input signal into a differential signal. In some embodiments, the single-ended CTSD ADC is an integrated single-ended CTSD ADC device and the input circuitry is internal to the single-ended CTSD ADC device. The single-ended CTSD ADC may further include DAC circuitry, integrator circuitry, and quantizer circuitry. The DAC circuitry may generate a feedback signal based on an output of the quantizer circuitry. The input circuitry, the DAC circuitry, and the integrator circuitry may be connected to a pair of nodes (e.g., referred to as second nodes) where the feedback signal is combined with the differential signal. The integrator circuitry may integrate the combined signal in a continuous-time basis, and the quantized circuitry may quantize the combined signal into a digital code including one or more bits.

The input circuitry may include a pair of input resistors, each coupled to one of the pair of input nodes. The input circuitry may further include a pair of input switches (e.g., CMOS devices), each coupled to one of the pair of input resistors in series. According to embodiments of the present disclosure, the input circuitry may further include an amplifier to inject a common mode signal at a pair of nodes (e.g., referred to as first nodes), each before one of the pair of input switches. Each of the first nodes may be a junction or connection point between one of the pair of input resistors and a corresponding one of the pair of input switches. At the first nodes, the single-ended input signal is converted into a differential signal by subtracting the common mode signal from the single-ended input signal. Because the pair of first nodes is in front (e.g., upstream) of the pair of input switches, signals flowing through the pair of input switches are differential. Thus, nonlinear error generated by the pair of input switches may cancel each other. Accordingly, it is important to convert the single-ended input signal into a differential signal prior to inputs of the pair of input switches, and not downstream of the input switches or at the outputs of the input switches.

In some embodiments, the amplifier can be configured in a feedback configuration to provide the common mode signal for single-ended-to-differential conversion. For instance, the amplifier may be a common mode amplifier having one non-inverting input and two inverting inputs, first and second inverting inputs. The non-inverting input may be coupled to a voltage rail set to a target common mode voltage desired at the output of the pair of input switches. The first inverted input may be coupled to an output of one of the pair of switches, and the second inverted input may be coupled to an output of the other one of the pair of switches. In some embodiments, the common mode amplifier may further include two outputs, where each output is connected directly to a corresponding one of the pair of first nodes. In other embodiments, the common mode amplifier may include a single output connected to each of the pair of first nodes via a respective resistor. In some instances, the common mode amplifier with the single output may provide lower noise than the common mode amplifier with the two outputs. For instance, the two outputs may be generated from different physical paths internal to the common mode amplifier, and thus noise at the two outputs may be different (in amplitudes and/or phases) and may not be cancelled by the differential operations.

To provide a high accuracy with a low gain drift, the input switches can be sized such that for a full-scale positive input and/or a full-scale negative input at the pair of input nodes, the amount of current being injected from the input nodes (via the input circuitry) into the second nodes is substantially the same as the current being fed back by the DAC circuitry. In some embodiments, the single-ended CTSD ADC may further include level-shifter circuitry to adjust a level of the differential signal such that the differential signal processed by the integrator and the DAC is a fully differential signal. In such embodiments, the input switches can be sized such that for a full-scale positive input and/or a full-scale negative input, the amount of current being injected from the input nodes (via the input circuitry) into the second nodes is substantially the same as the sum of the current being fed back by the DAC circuitry and the current provided by the level-shifter circuitry.

In other embodiments, the amplifier in the input stage can be configured in a feedforward configuration to provide the common mode signal for single-ended-to-differential conversion. In the feedforward configuration, the outputs of the amplifier are connected to the pair of first nodes prior to the pair of input switches similar to the feedback configuration so that the input switches operate on a differential signal. However, the amplifier may include an inverting input coupled to the pair of input nodes (e.g., in a feedforward manner) and a non-inverted input coupled to a voltage rail set to a target common mode voltage desired at the output of the pair of input switch.

The systems, schemes, and mechanisms described herein advantageously arrange the amplifier in the input stage such that the single-ended-to-differential conversion occurs upstream of the input switches (e.g., CMOS devices). In this way, the nonlinear error (e.g., the quadratic terms) generated by the input switches can be cancelled by differential circuitry's operations. Further, the sizing of input switches to balance current injected from the input circuitry to the second nodes and current from the DAC circuitry and the level-shifter circuitry (if present) can provide a low gain drift for full-scale positive and/or full-scale negative inputs. While the present disclosure is described in the context of a single-ended CTSD ADC, the present disclosure is suitable for use in any single-ended CTSD modulator and/or any integrated devices with a single-ended CTSD modulator. The inclusion of a single-ended-to-different input stage in an integrated CTSD modulator or CTSD ADC that can provide low-noise, high-accuracy can eliminate the need for external single-ended-to-different circuitry. Accordingly, the present disclosure can lower cost and/or area and/or simplify design in a system using CTSD modulator or CTSD ADC.

Example Fully Differential CTSD Modulator

FIG. 1 is a schematic diagram illustrating an exemplary fully differential CTSD modulator 100. For simplicity of discussion and illustration, FIG. 1 illustrates a first-order, single-bit, and single-stage CTSD modulator 100. However, the CTSD modulator described herein can be scaled to provide a higher-order, multi-bit, and/or multi-stage CTSD modulator. As shown in FIG. 1, the CTSD modulator 100 may include two signal paths 104 and 106, a pair of input nodes 102, input circuitry 110, DAC circuitry 120, integrator circuitry 130, and quantizer circuitry 140 coupled to the signal paths 104 and 106. In order not to clutter drawings provided in the FIGURES, reference numerals to pairs of differential components or nodes along the two paths 104 and 106 are shown only on one path (e.g., reference numeral 102 points only to the input node coupled to the signal path 104, but not to the input node coupled to the signal path 106, even though it refers to both).

As further shown in FIG. 1, the input circuitry 110 may include a pair of input resistors 112 (e.g., having a resistance R), each disposed along one of the signal path 104 or the signal path 106 and coupled to a corresponding one of the pair of differential input nodes 102. The input circuitry 110 may further include a pair of input switches 114 represented by SWI, each disposed along one of the signal paths 104 or 106 and coupled to a corresponding one of the pair of resistors 112 in a series configuration. The input switches 114 can be implemented using complementary CMOS devices (e.g., transistors). In the illustrated example, the input switches 114 are n-type metal-oxide-semiconductor (NMOS) devices. For instance, each of the input switch 114 may include a gate terminal driven by a logical signal (e.g., a logic high) and source/drain terminals connected between a corresponding resistor 112 and the DAC circuitry 120. In other instances, the input switches 114 can be implemented using p-type metal-oxide-semiconductor (PMOS) devices.

The DAC circuitry 120 is a current steering DAC and may include one or more current steering elements 121. In general, an N-bit DAC may include N number of current steering elements 121. In the illustrated example of FIG. 1, the DAC circuitry 120 is a 1-bit DAC including one current steering element 121. The current steering element 121 may include resistors 122 (e.g., having a resistance R) and switches 124 and 126 represented by SWR. Similar to the switches 114, the switches 124 and 126 can be implemented using CMOS devices. In the illustrated example, the input switches 124 and 126 are NMOS devices. As shown, the switches 124 are controlled by a digital codeword D (an output of the quantizer circuitry 140 being fed back to the DAC circuitry 120). The switches 126 are controlled by the complement of D represented by $\overline{D}$. That is, when the switches 124 is in a closed state, the switches 126 are in an open state and vice versa. The resistor 122 shown at the top of the DAC circuitry 120 is coupled to a reference voltage rail represented by $V_{REF}$ and to one of the signal paths 104 or 106 depending on which of the switch 124 or switch 126 is closed. In a similar way, the resistor 122 shown at the bottom of the DAC circuitry 120 is coupled to a ground potential represented by the inverted triangle symbol and to one of the signal paths 104 or 106 depending on which of the switch 124 or switch 126 is closed.

The integrator circuitry 130 may include an operational amplifier 134, which may be represented by A1, and integrating capacitors 132 that couple outputs of the operational amplifier 134 with respective inputs of the operational amplifier 134 at a pair of nodes 108, which may be represented by ip and in. The integrator circuitry 130 may shape quantization noise such that the quantization noise is in a higher frequency region outside the frequency band of interest.

The quantizer circuitry 140 may include one or more comparators 142. In general, an N-bit ADC may include N number of comparators 142. In the illustrated example of FIG. 1, the quantizer circuitry 140 is a 1-bit ADC including one comparator 142. In some embodiments, an N-bit ADC can be used along with an N-bit DAC in a CTSD modulator as will be discussed more fully below in FIG. 13.

In operation, the input circuitry 110 may receive a differential analog input voltage signal across the pair of input nodes 102. For instance, the input voltage at the input node 102 to the signal path 104 may be represented by $V_{INP}$, and the input voltage at the input node 102 to the signal path 106 may be represented by $V_{INM}$. In some instances, $V_{INP}$ may be a positive voltage, and $V_{INM}$ may be a negative voltage. The input resistors 112 may convert the analog input signal into current and the current is injected into the integrator circuitry 130 at the nodes ip and in 108. The integrator circuitry 130 may integrate current received at the nodes ip and in 108. The quantizer circuitry 140 may quantize the output of the integrator circuitry 130 at a sampling rate according to an input clock signal (at the terminal Ck of the comparator 142). For instance, if the output of the integrator circuitry 130 is above a threshold, the quantizer circuitry 140 outputs a digital code D or bit value of 1 (a logic high). Conversely, if the output of the integrator circuitry 130 is below the threshold, the quantizer circuitry 140 outputs a digital code D or bit value of 0 (a logic low). In some embodiments, the sampling rate or the clock signal used by the quantizer circuitry 140 may be higher than a desired data rate to provide oversampling. Oversampling may distribute quantization noise over a wider bandwidth than the desired signal bandwidth, and thus may reduce noise in the desired signal bandwidth. The digital code D is fed back to the DAC circuitry 120 (to operate the switches 124 and 126 as discussed above). The DAC circuitry 120 may generate a feedback signal (e.g., a feedback current signal) according to the digital code D. At the nodes ip and in 108, the feedback current signal is combined with the current injected by the input circuitry 110 before being integrated by the integrator circuitry 130.

Under an ideal operating condition, the current generated by the DAC circuitry 120 may match the current injected by the input circuitry 110, and the output of the quantizer circuitry 140 may provide an accurate digital representation of the analog input signal. As an example, for a full-scale positive input, $V_{INP}$ may be at a voltage level of $V_{REF}$ and $V_{INM}$ may be at a voltage level of 0 V (e.g., ground potential). The quantizer circuitry 140 may output a bit value of 1. Thus, at the DAC circuitry 120, the switches 124 are closed and the switches 126 are opened. Accordingly, current from the left side or left leg of the current steering element 121 may flow from $V_{REF}$ (through the resistor 122 and the closed switch 124 shown at the top of the DAC circuitry 120) to the signal path 106 (at point A) and then to ground because $V_{INM}$ is connected to ground. Current from $V_{INP}$ may flow along the signal path 104 to the right side or right leg of the current steering element 121 (at point B) and then to ground (through the closed switch 124 and resistor 122 shown at the bottom of the DAC circuitry 120). In other words, all the current injected by the input circuitry 110 is absorbed by the DAC circuitry 120. As such, there is no current flowing into the integrator circuitry 130, and hence the output of the integrator circuitry 130 may remain stable and the quantizer circuitry 140 may continue to output digital codes 1. For a full-scale negative input, $V_{INP}$ may be at a voltage level of 0 V and $V_{INM}$ may be at a voltage level of $V_{REF}$. The CTSD modulator 100 may operate in substantially the same way as with the full-scale positive input, but may continue to output digital codes 0 instead of 1.

In order to achieve a high-gain accuracy across process, voltage, and temperature (PVT), the resistance of the input circuitry 110 is matched to the resistance of the DAC circuitry 120 so that the current fed back from the DAC circuitry 120 matches the current injected by the input circuitry 110. For instance, the input switches 114 in the input circuitry 110 are always-on (driven by logic high signals at the gates of the transistors). The input switches 114 may be substantially the same as the switches 124 and 126 in the DAC circuitry 120. More specifically, each of the switches 114 may have the same on-state resistance, and substantially the same on-state resistance as each switch 124, 126. The purpose for including the input switches 114 in the input circuitry is to match the on-state resistances of the switches of 124, 126. Similarly, each input resistors 112 may have substantially the same resistance as each resistor 122. While CMOS devices are generally suitable for implementing switches, CMOS devices can generate harmonics (e.g., nonlinear quadratic terms). However, because the CTSD modulator 100 is a fully differential circuit, the nonlinear quadratic error from the differential paths 104 and 106 may cancel each other, and thus the output of the differential CTSD modulator 100 may be free of the nonlinear quadratic noise.

Example CTSD Analog-to-Digital Converter (ADC)

Figure 2:
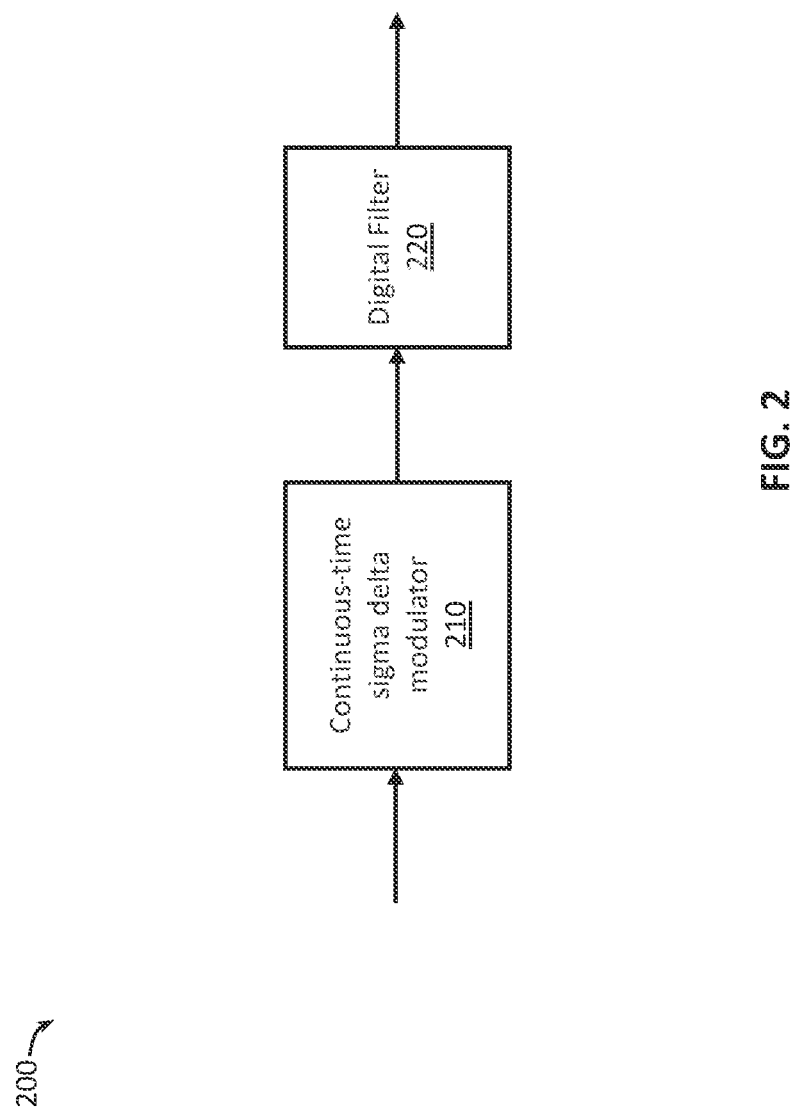
FIG. 2 is a block diagram illustrating an exemplary CTSD analog-to-digital converter (ADC)

FIG. 2 is a block diagram illustrating an exemplary CTSD ADC 200. The CTSD ADC 200 may include the CTSD modulator 210 and digital filter circuitry 220. The CTSD modulator 210 may be substantially similar to the CTSD modulator 100 of FIG. 1. As explained above, the CTSD modulator 100 may shape quantization noise such that the quantization noise may reside in the higher frequency region outside of the signal frequency band of interest. As such, the digital filter circuitry 220 may operate as a digital low-pass filter to filter out the high-frequency quantization noise from the digital signal output by the CTSD modulator 210. As further explained above, the CTSD modulator 100 can perform oversampling to further lower the noise by distributing quantization noise over a wider bandwidth than the bandwidth of interest. For instance, the CTSD ADC 200 may be an oversampling CTSD ADC, in which the CTSD modulator 210 may produce a digital signal at a data rate corresponding to an over-sampled sample clock rate. Accordingly, the digital filter circuitry 220 may also operate as a decimating digital filter to down-sample the digital signal to a desired data rate.

The CTSD modulator 100 shown in FIG. 1 is fully differential, and the common mode voltage at the virtual ground inputs ip and in (the nodes 108) of the integrating amplifier 134 is determined by the common mode of the input voltages at the pair of input nodes 102, which may be represented by $(V_{INP}+V_{INM})/2$. This prevents the use of the CTSD modulator 100 circuit shown in FIG. 1 directly in a single-ended configuration, where one input node 102 is tied to ground. In a single-ended configuration, $V_{INM}$ may be set to a fixed reference voltage, such as ground (0V), causing the common mode voltage at the nodes ip and in 108 to experience large excursions as the input voltage $V_{INP}$ changes. It may be difficult to design a feedback DAC (e.g., the DAC circuitry 120) and/or an operational amplifier (e.g., the amplifier A1 132) for the integration to accommodate a large common mode voltage. To accommodate a single-ended input, a common mode amplifier may be utilized to convert a single-ended input signal into a differential signal as shown in FIG. 3.

Example Single-Ended CTSD Modulator

Figure 3:
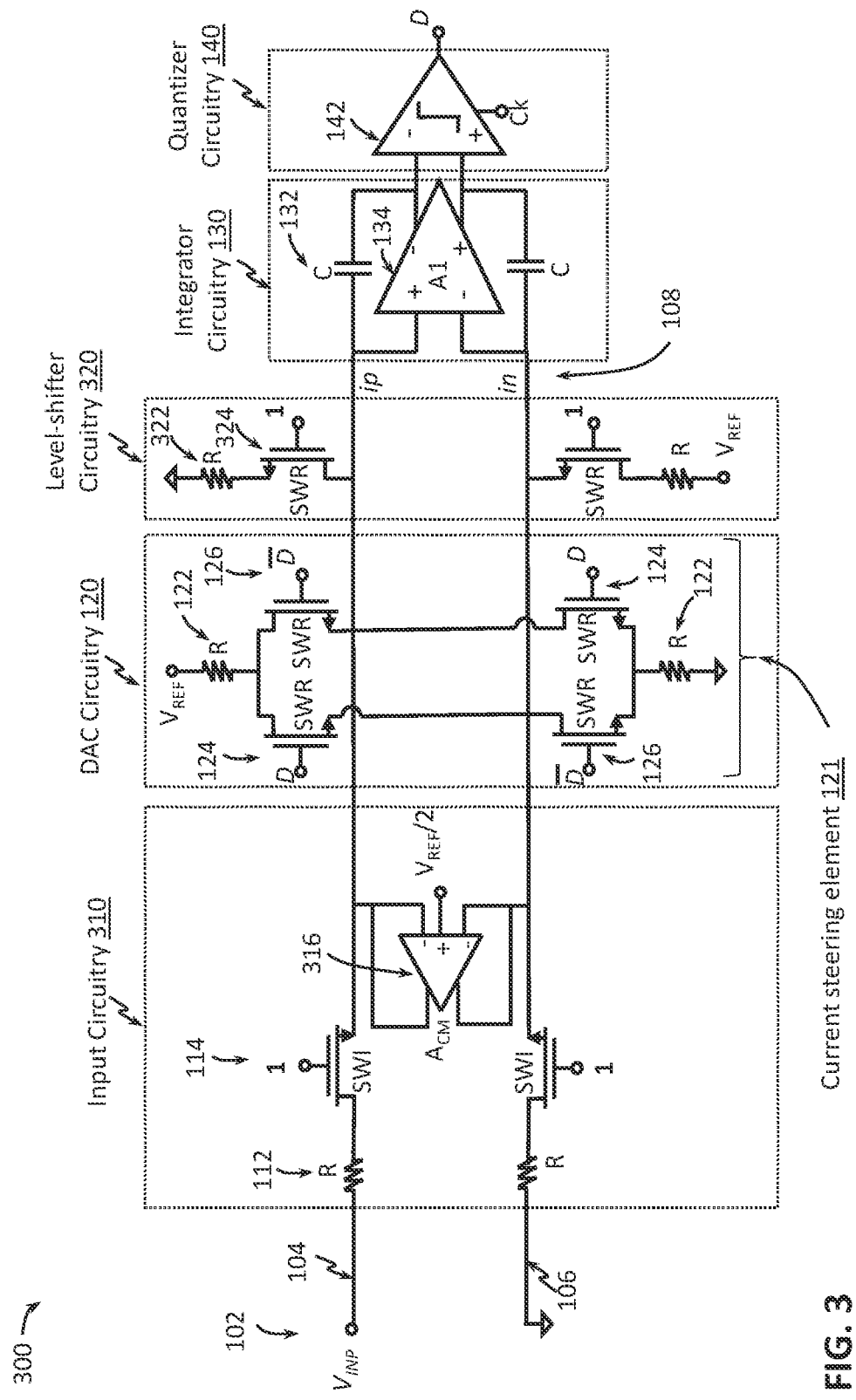
FIG. 3 is a schematic diagram illustrating an exemplary single-ended CTSD modulator.

FIG. 3 is a schematic diagram illustrating an exemplary single-ended CTSD modulator 300. In some embodiments, the single-ended CTSD modulator 300 may correspond to the CTSD modulator 210 in the CTSD ADC 200 of FIG. 2. Generally speaking, the single-ended CTSD modulator 300 may be similar to the CTSD modulator 100 in many respects. For example, the single-ended CTSD modulator 300 shares the same circuitry including DAC circuitry 120, integrator circuitry 130, and quantizer circuitry 140 as the CTSD modulator 100 of FIG. 1. For brevity's sake, a discussion of these circuitries is not repeated, and these circuitries may take the form of any embodiments disclosed herein.

As shown in FIG. 3, the CTSD modulator 300 may include input circuitry 310 substantially similar to the input circuitry 110 of FIG. 1. However, the input circuitry 310 includes an additional common mode amplifier 316, which may be represented by $A_{CM}$. In some instances, the common mode amplifier 316 may be referred to as a servo amp. The input circuitry 310, the DAC circuitry 120, the integrator circuitry 130, and the quantizer circuitry 140 in the CTSD modulator 300 may be coupled to the two signal paths 104 and 106 and the pair of input nodes 102 in substantially the same manner as in the CTSD modulator 100. However, the pair of input nodes 102 may receive a singled-ended input signal instead of a differential input signal as in FIG. 1.

The common mode amplifier 316 is utilized to provide common mode current to the signal paths 104 and 106 (e.g., at the nodes ip and in 108 or inputs to the integrator circuitry 130). As shown, the common mode amplifier 316 may include a non-inverting input (shown by the "+" symbol) and two inverting inputs (shown by the "−" symbols). The two inverting inputs are each coupled to one of the signal paths 104 and 106 downstream of the pair of input switches 114. As shown, each of the inverting inputs are coupled to the output of one of the input switches 114. The non-inverting input may be coupled to a voltage rail set to a target common mode voltage desired at the nodes ip and in 108. The common mode amplifier 316 may further include two outputs each coupled to one of the signal paths 104 and 106 downstream of the pair of input switches 114. As shown, the outputs of the common mode amplifier 316 are also coupled to the outputs of the input switches 114.

As an example, the CTSD modulator 300 may receive a single-ended analog input signal at the pair of input nodes 102, where the voltage level at the input node 102 of the signal path 104 may be represented by $V_{INP}$ and the input node 102 of the signal path 106 may be connected to a ground potential. The voltage level $V_{INP}$ at the input node 102 of the signal path 104 may span any suitable voltage range. In some examples, the voltage level $V_{INP}$ may be between 0 V to $2V_{REF}$ V, where $V_{REF}$ may represent a certain reference voltage for the CTSD modulator 300. To convert the single-ended input signal into a differential signal, the desired common mode voltage at the nodes ip and in 108 may be $V_{REF}/2$. Accordingly, the non-inverting input of the common mode amplifier 316 is set to $V_{REF}/2$. In operation, the common mode amplifier 316 may sense the common mode voltage at the nodes ip and in 108. The common mode amplifier 316 may operate to force the common mode voltage at the nodes ip and in 108 to be at the desired voltage $V_{REF}/2$ by injecting common mode current into the signal paths 104 and 106 based on the sensing. The common mode current injected by the common mode amplifier 316 can cancel the common mode current injected from the input nodes 102 (via the input resistors 112), thus providing a differential signal to the remaining circuitries (the DAC circuitry 120, integrator circuitry 130, and quantizer circuitry 140) in the signal paths 104 and 106. The DAC circuitry 120, integrator circuitry 130, and quantizer circuitry 140 may operate in substantially the same way as in the CTSD modulator 100 of FIG. 1.

In some embodiments, the CTSD modulator 300 may further include a level-shifter circuitry 320 coupled to the nodes ip and in 108, for example, depending on the range of voltage levels spanned by $V_{INP}$. As shown, the level-shifter circuitry 320 may include a pair of resistor 322 and switch 324 connected in series and between a voltage rail set to $V_{REF}$ and the node ip 108 on the signal path 104, and another pair of resistor 322 and switch 324 connected in series and between a ground potential and the node in 108 on the signal path 106. Each resistor 322 may have the same resistance R as the input resistors 122 in the input circuitry 310 and the resistors 122 in the DAC circuitry 120. Each switch 324 is represented by SWR and may have the same on-state resistance as the input switches 124 in the input circuitry 310 and the switches 124 and 126 in the DAC circuitry 120. The level-shifter circuitry 320 may adjust the signal levels along the signal paths 104 and 106 so that a fully differential signal may be provided to the DAC circuitry 120 and the integrating amplifier 134 for processing.

As an example, the voltage $V_{INP}$ may be set to $2V_{REF}$ at the input node 102 of the signal path 104 and the input node 102 of the signal path 106 may be connected to a ground potential (e.g., at 0 V). After the common mode amplifier 316 providing the common mode cancellation, the voltage signals across the nodes ip and in 108 are differential, but not fully differential. For example, the voltage signals may not be centered at 0 V with equal amplitudes and opposite phases. The level-shifter circuitry 320 may introduce a $-V_{REF}$ shift to the voltage signal across the signal paths 104 and 106 to center the voltage signal at 0 V, providing a fully differential signal to the DAC circuitry 120 and the integrator circuitry 130.

Similar to the DAC circuitry 120, the level-shifter circuitry 320 may inject current to the signal paths 104 and 106 via a corresponding pair of resistor 322 and switch 324. In general, the CTSD modulator 300 is configured such that the current injected from the input nodes 102 to the nodes ip and in 108 is substantially the same as the combined current from DAC circuitry 120 and the level-shifter circuitry 320 (e.g., sum of the feedback current generated by the DAC circuitry 120 and the level-adjusting current generated by the level-shifter circuitry 320). Depending on the voltage at the input node 102 of the signal path 106, in some embodiments, the CTSD modulator 300 may not include the level-shifter circuitry 320, for example, when the voltage at the input node 102 of the signal path 106 is biased to $V_{REF}$ or when $V_{INP}=0V$ and the signal at the signal path 104 spans over a range from $-V_{REF}$ to $V_{REF}$. In such embodiments, the CTSD modulator 300 is configured such that the current injected from the input nodes 102 to the nodes ip and in 108, after the removal of the common mode component, is substantially the same as the feedback current generated by the DAC circuitry 120, without the need of a level adjusting current from a level shifter leg.

While the common mode amplifier 316 in the input circuitry 310 can provide a differential current to the DAC circuitry 120, integrator circuitry 130, and quantizer circuitry 140, the placement of the common mode amplifier 316 may not be optimal. As explained above, the switches 114 implemented using CMOS devices can generate nonlinear quadratic error. In the CTSD modulator 100, because of the current flowing through the inputs switches 114 is differential, the nonlinear quadratic error along the signal paths 104 and 106 can cancel each other out. Here, in FIG. 3, the conversion of single-ended-to-differential does not occur until after the input switches 114. Thus, in the CTSD modulator 300, the current flowing through the input switches 114 is single-ended, and not differential. Accordingly, the CTSD modulator 300 cannot benefit from the nonlinear quadratic error cancellation that are provided by a differential circuit.

Example High-Accuracy and/or Low-Noise Single-Ended CTSD Modulators

Figure 4:
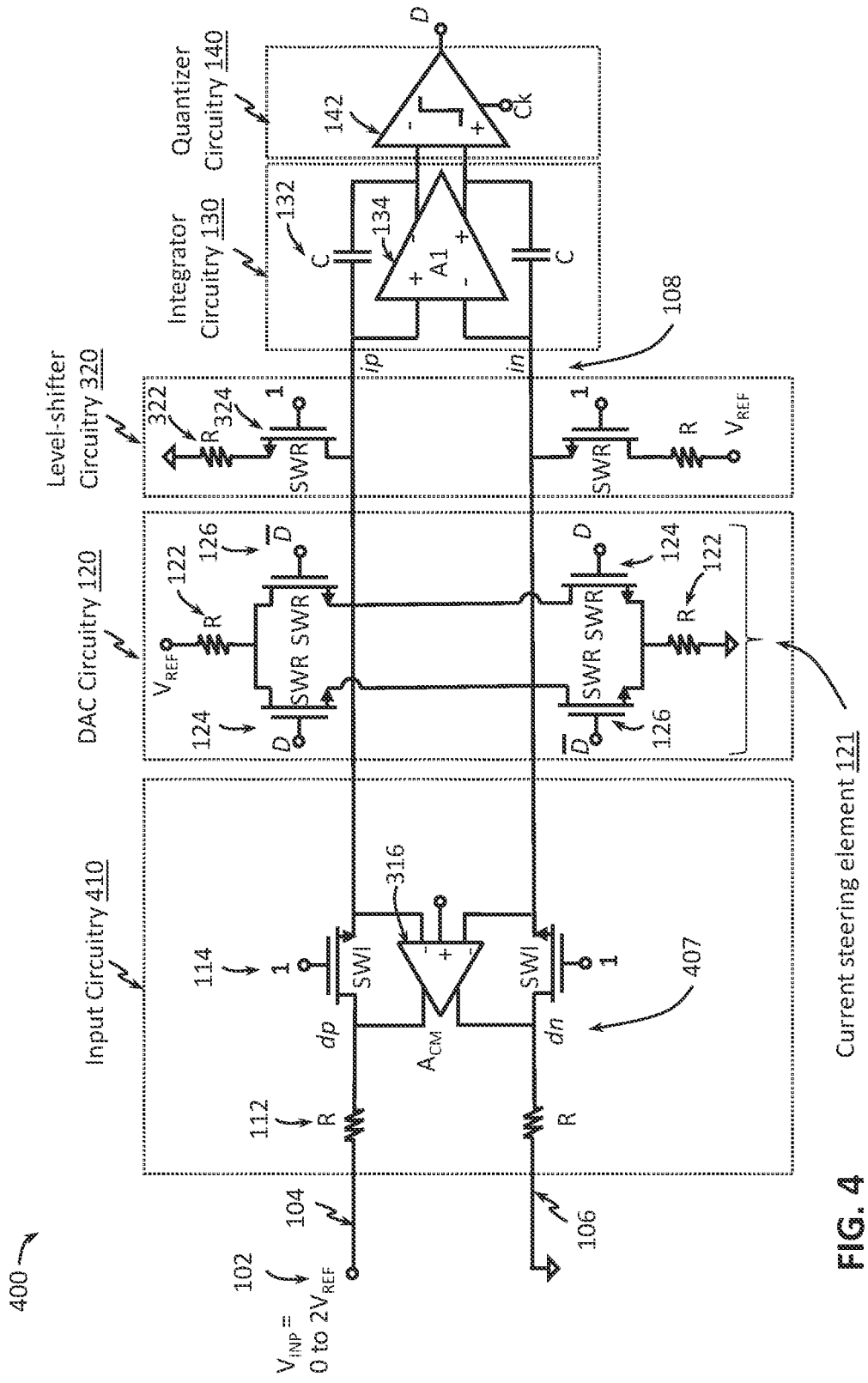
FIG. 4 is a schematic diagram illustrating an exemplary high-linearity single-ended CTSD modulator, according to some embodiments of the present disclosure.

FIG. 4 is a schematic diagram illustrating an exemplary high-linearity single-ended CTSD modulator 400, according to some embodiments of the present disclosure. In some embodiments, the single-ended CTSD modulator 400 may correspond to the CTSD modulator 210 in the CTSD ADC 200 of FIG. 2. Generally speaking, the single-ended CTSD modulator 400 may be similar to the CTSD modulators 100 and 300 in many respects. For example, the single-ended CTSD modulator 400 shares the same circuitry including DAC circuitry 120, integrator circuitry 130, and quantizer circuitry 140 as the CTSD modulator 100 of FIG. 1 and the CTSD modulator 300 of FIG. 3 and the same level-shifter circuitry 320 as the CTSD modulator of FIG. 3. For brevity's sake, a discussion of these circuitries is not repeated, and these circuitries may take the form of any embodiments disclosed herein.

As shown in FIG. 4, the CTSD modulator 400 may include input circuitry 410 substantially similar to the input circuitry 310 of FIG. 3. For instance, the input circuitry 410 may include a common mode amplifier $A_{CM}$ 316, where inverting inputs of the common mode amplifier 316 are coupled to the outputs (downstream) of the input switches 114 and the non-inverting input of the common mode amplifier 316 is coupled to a voltage rail set to a target common mode voltage (e.g., at $V_{REF}/2$) desired at the nodes ip and in 108. However, in contrast to the input circuitry 310 in FIG. 3, outputs of the common mode amplifier 316 are connected to a pair of nodes 407 represented by dp and dn at the inputs (upstream) of the input switches 114 instead of at the outputs of the input switches 114.

Similar to the CTSD modulator 300, the CTSD modulator 400 may receive a single-ended signal at the input nodes 102. However, because the outputs of the common mode amplifier 316 are connected upstream (in front) of the input switches 114, the common mode amplifier 316 may inject common mode current into the signal paths 104 and 106 before the inputs of the switches 114. The injected common mode current may cancel the common mode component in the single-ended input signal to provide a differential current. In other words, the single-ended-to-differential conversion occurs before the inputs of the input switches 114, and thus signals along the signal paths 104 and 106 subsequent to (downstream of) the nodes dp and dn 407 are differential. As such, current flowing through the input switches 114 is differential (without the common mode component), enabling cancellation of nonlinear quadratic error (generated by the input switches 114) along the signal paths 104 and 106.

In the CTSD modulator 400, the DAC circuitry 120, the integrator circuitry 130, and the quantizer circuitry 140 in the CTSD modulator 300 may be coupled to the signal paths 104 and 106 and operate in substantially the same way as in the CTSD modulator 100 of FIG. 1 and the CTSD modulator 300 of FIG. 3. Similarly, the level-shifter circuitry 320 may be coupled to the signal paths 104 and 106 and operate in substantially the same way as in the CTSD modulator 300 of FIG. 3. For example, the voltage $V_{INP}$ may be set to $2V_{REF}$ at the input node 102 of the signal path 104 and the input node 102 of the signal path 106 may be connected to a ground potential (e.g., at 0 V). After the common mode amplifier 316 providing the common mode cancellation, the voltage signals across the nodes dp and dn 407 are differential, but not fully differential. For example, the voltage signals may not be centered at 0 V with equal amplitudes and opposite phases. The level-shifter circuitry 320 may introduce a $-V_{REF}$ shift to the voltage signal across the signal paths 104 and 106 to center the voltage signal at 0 V, providing a fully differential signal to the DAC circuitry 120 and the integrator circuitry 130.

The CTSD modulator 400 is configured such that the current injected from the input nodes 102 to the nodes ip and in 108 is substantially the same as the combined current from DAC circuitry 120 and the level-shifter circuitry 320 (e.g., sum of the feedback current generated by the DAC circuitry 120 and the level-adjusting current generated by the level-shifter circuitry 320). Depending on the voltage at the input node 102 of the signal path 106, in some embodiments, the CTSD modulator 400 may not include the level-shifter circuitry 320, for example, when the voltage at the input node 102 of the signal path 106 is biased to $V_{REF}$ or when Vinp=0V and the signal at 104 spans over a range from $-V_{REF}$ to $V_{REF}$. In such embodiments, the CTSD modulator 400 is configured such that the current injected from the input nodes 102 to the nodes ip and in 108, after the removal of the common mode component, is substantially the same as the feedback current generated by the DAC circuitry 120, without the need of a level adjusting current from a level shifter leg.

Figure 5:
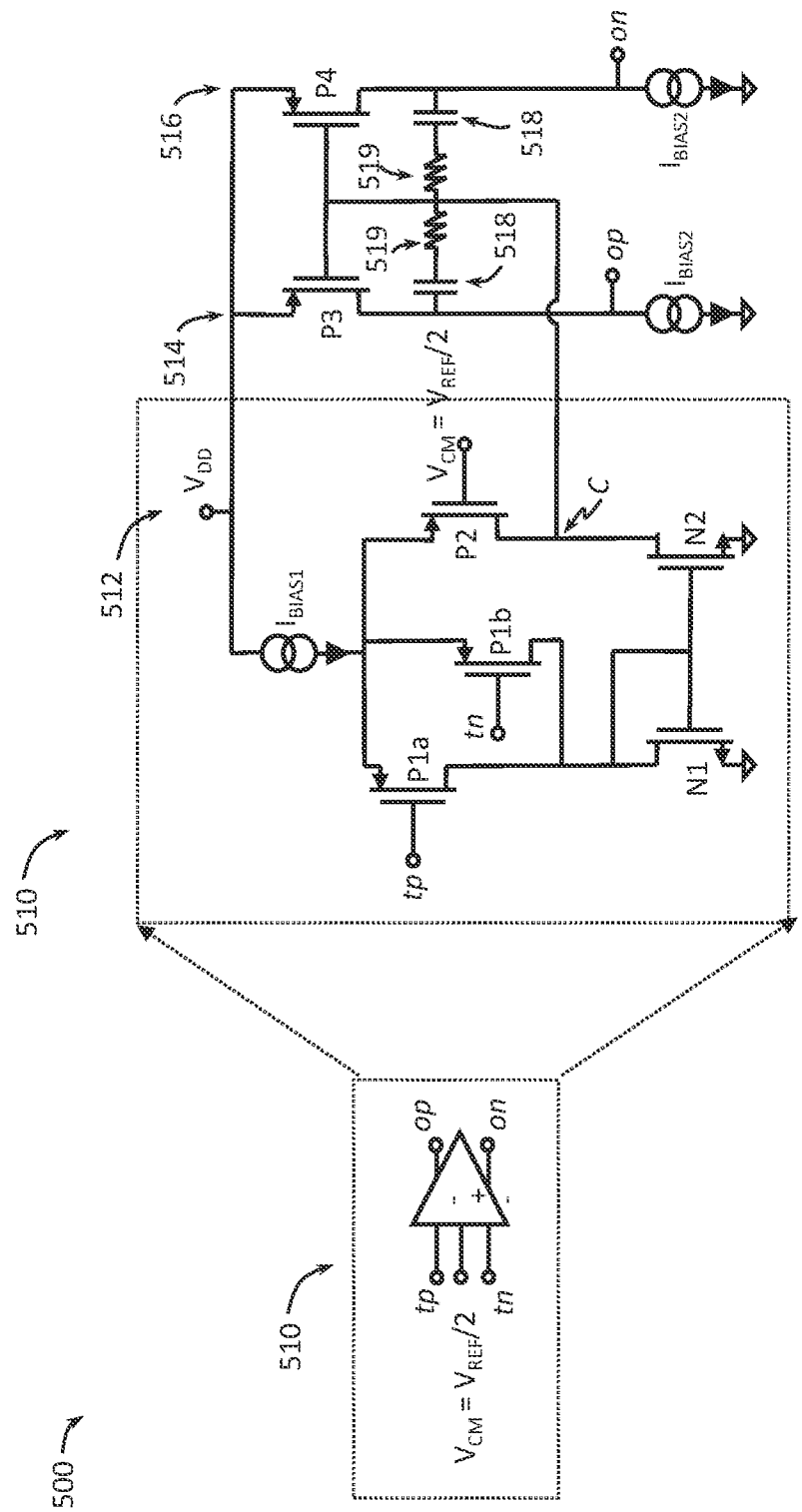
FIG. 5 is a schematic diagram illustrating an exemplary common mode amplifier arrangement, according to some embodiments of the present disclosure.

FIG. 5 is a schematic diagram illustrating an exemplary common mode amplifier arrangement 500, according to some embodiments of the present disclosure. The common mode amplifier arrangement 500 can be implemented by the common mode amplifier 316 in the input circuitry 310 of FIG. 3 and/or the input circuitry 410 of FIG. 4. As shown in FIG. 5, a common mode amplifier 510 may be similar to the common mode amplifier 316, for example, including two inverting input terminals (shown by the "−" symbols) represented by tp and tn, a non-inverting input (shown by the "+" symbol), and differential output terminals represented by op and on. When the common mode amplifier 510 is used in the input circuitry 410 of FIG. 4, each of inverting input terminals tp and tn may be coupled one of the nodes ip and in 108, the non-inverting input (which may be referred to as a reference common mode voltage terminal) can be coupled to a voltage rail set to a target or desired common mode voltage, $V_{CM}$, (e.g., $V_{REF}/2$), and the output terminals may be coupled to the nodes dp and dn 407.

The right-side of FIG. 5 provides a more detailed view of the internal arrangement of the common mode amplifier 510. As shown, the common mode amplifier 510 may include a first stage 512 including three PMOS devices represented by P1a, P1b, and P2 connected in parallel. The gate terminals of the PMOS devices P1a, P1b, and P2 may each receive one of the first inverting input tp, the second inverted input tn, and the non-inverted input, respectively. The first stage 512 of the common mode amplifier 510 may further include two NMOS devices represented by N1 and N2. The two NMOS devices may operate with the three PMOS devices to provide a first voltage (at connection point C). The first stage 512 may operate on common mode signals. For instance, the inputs from tp and tn are averaged and compared to the target common mode voltage $V_{CM}$.

The common mode amplifier 510 may further include two PMOS devices represented by P3 and P4, each on a separate leg 514 and 516, respectively, for example forming a second stage. The gate terminals of the PMOS devices P3 and P4 may each operate based on the first voltage (e.g., a bias voltage) provided by the first stage 512. As further shown in FIG. 5, the legs 514 and 516 are connected via a compensation network including capacitors 518 and resistors 519. The leg 514 may provide an output to the node op, and the leg 516 may provide an output to the output node on.

Since the output nodes op and on are provided by the separate physical legs 514 and 516, respectively, the noise generated by the PMOS device P3 may be different than the noise generated the PMOS device P4. In other words, the differential noise (e.g., flicker noise from P3 and P4) injected by the output legs 514 and 516 may not have the same amplitude and/or opposite polarities. While additional circuitry such as a chopper circuitry may be used to reduce the flicker noise, large switches and/or large capacitors may be required to provide a sufficient amount of noise reduction. Accordingly, it may be desirable to utilize a common mode amplifier with a single output leg (shown in FIG. 6) instead of two physically separate output legs for common mode current injection.

Figure 6:
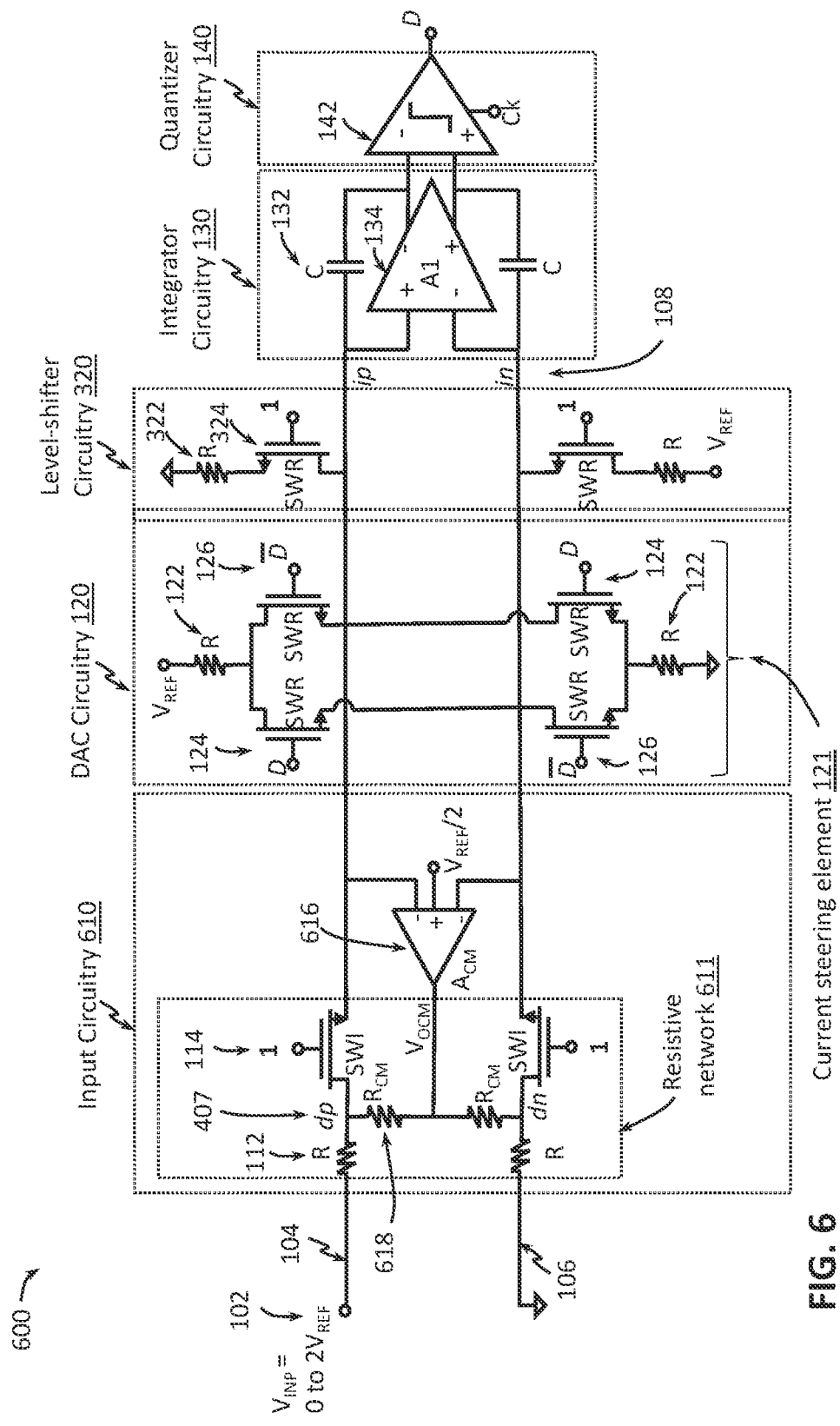
FIG. 6 is a schematic diagram illustrating an exemplary low-noise, high-linearity single-ended CTSD modulator, according to some embodiments of the present disclosure.

FIG. 6 is a schematic diagram illustrating an exemplary low-noise, high-linearity single-ended CTSD modulator 600, according to some embodiments of the present disclosure. In some embodiments, the single-ended CTSD modulator 600 may correspond to the CTSD modulator 210 in the CTSD ADC 200 of FIG. 2. Generally speaking, the single-ended CTSD modulator 600 may be similar to the CTSD modulators 100, 300, and 400 in many respects. For example, the single-ended CTSD modulator 600 shares the same circuitry including DAC circuitry 120, integrator circuitry 130, and quantizer circuitry 140 as the CTSD modulator 100 of FIG. 1, the CTSD modulator 300 of FIG. 3, and the CTSD modulator 400 of FIG. 4 and the same level-shifter circuitry 320 as the CTSD modulator 300 of FIG. 3 and the CTSD modulator 400 of FIG. 4. For brevity's sake, a discussion of these circuitries is not repeated, and these circuitries may take the form of any embodiments disclosed herein.

As shown in FIG. 6, the CTSD modulator 600 may include input circuitry 610 substantially similar to the input circuitry 410 of FIG. 4. For instance, the input circuitry 610 may include a common mode amplifier 616 (servo amp) represented by $A_{CM}$, where inverting inputs of the amplifier 616 are coupled to the outputs (downstream) of the pair of input switches 114 and the non-inverting input of the common mode amplifier 616 is coupled to a voltage rail set to a desired common mode voltage (e.g., at $V_{REF}/2$) at the nodes ip and in 108. However, the common mode amplifier 616 may include a single output represented by $V_{OCM}$ instead of two outputs as in the common mode amplifier 316. Furthermore, the single output may output a common mode voltage represented by $V_{OCM}$ and may be coupled to the nodes dp and dn 407 via common mode resistors 618 (e.g., having a resistance $R_{CM}$). Each of the common mode resistors 618 may convert the common mode voltage into common mode current, which is then injected into the nodes dp and dn 407. As shown, the input resistors 112, the input switches 114, and the common mode resistors 618 forms a resistive network 611 in a resistive T-network configuration.

The common mode amplifier 616 in the input circuitry 610 may provide substantially the same functionalities as the common mode amplifier 316 in the input circuitry 410 of FIG. 4. For example, the common mode amplifier 616 may inject common current into the input circuitry 610 so that a common mode component of a single-ended input signal at the input nodes 102 may be cancelled. However, because the common mode amplifier 616 includes a single output, the common mode amplifier 616 may have a single output leg internally (shown in FIG. 7) and the same noise (e.g., same amplitudes) is injected into the nodes dp and dn 407. As the circuit is differential (at the nodes ip and in 108), the circuit may respond to differences between the nodes ip and in 108. Thus, adding the same amount of noise (by the common mode amplifier 616) to both nodes 108 may introduce no difference (e.g., no differential voltage) to the circuit. Hence, the differential amplifier 134 may "ignore" (or reject) the noise added by the common mode amplifier 616. Accordingly, the CTSD modulator 600 can provide a lower noise and better accuracy than the CTSD modulator 400.

Figure 7:
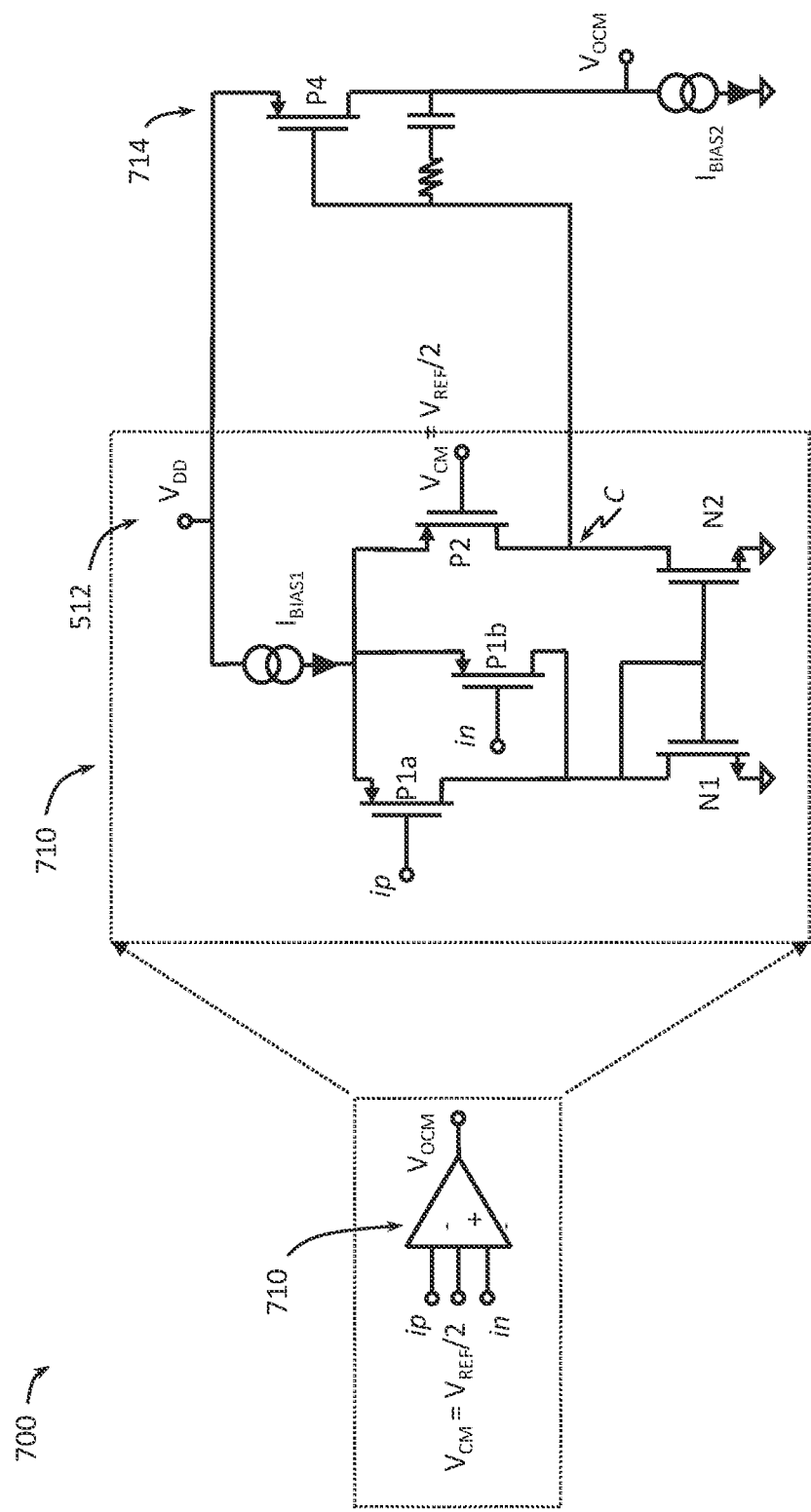
FIG. 7 is a schematic diagram illustrating another exemplary common mode amplifier arrangement, according to some embodiments of the present disclosure.

FIG. 7 is a schematic diagram illustrating another exemplary common mode amplifier arrangement 700, according to some embodiments of the present disclosure. The common mode amplifier arrangement 700 can be implemented by the common mode amplifier 616 in the input circuitry 610 of FIG. 6. As shown in FIG. 7, a common mode amplifier 710 may be similar to the common mode amplifier 616, for example, including two inverting input terminals (shown by the "–" symbols) represented by tp and tn, a non-inverting input (shown by the "+" symbol), and a single output terminal providing an output common mode voltage represented by $V_{OCM}$. When the common mode amplifier 710 is used in the input circuitry 610 of FIG. 6, each of inverting input terminals tp and tn may be coupled one of the nodes ip and in 108, the non-inverting input (which may be referred to as a reference common mode voltage terminal) can be coupled to a voltage rail set to a target or desired common mode voltage, $V_{CM}$, (e.g., $V_{REF}/2$), and the output terminal may be coupled to the nodes dp and dn 407 via the resistors 618.

The right-side of FIG. 7 provides a more detailed view of the internal arrangement of common mode amplifier 710. Generally speaking, the internal arrangement of the common mode amplifier 710 may be similar to the internal arrangement of the common mode amplifier 510 of FIG. 5 in many respects. For example, the common mode amplifier 710 may utilizes the same first stage 512 circuitry as the common mode amplifier 510. For brevity's sake, a discussion of these circuitries is not repeated, and these circuitries may take the form of any embodiments disclosed herein. However, the common mode amplifier 710 may include a single output leg 714 with a PMOS device represented by P4 in a second stage instead of having two output legs 514 and 516 as in the common mode amplifier 510. Similar to the common mode amplifier 510, the PMOS device P4 is driven by the voltage provided by the first stage 512 (at connection point C). The output node $V_{OCM}$ is connected to the drain terminal of the PMOS device P4.

Referring back to FIG. 6, while utilizing the common mode amplifier 616 with a single output can provide a high linearity and low noise in the CTSD modulator 600, the inclusion of the common mode resistors $R_{CM}$ 618 in the input circuitry 610 can cause a gain drift in the CTSD modulator 600, for example, when operating with a positive full-scale input. In some examples, the gain drift may be in the order of tens of parts-per-million per degree (ppm/C). Analysis of the CTSD modulator 600 operating with a negative full-scale input is provided in FIG. 8. Analysis of the CTSD modulator 600 operating with a positive full-scale input is provided in FIG. 9.

Figure 8:
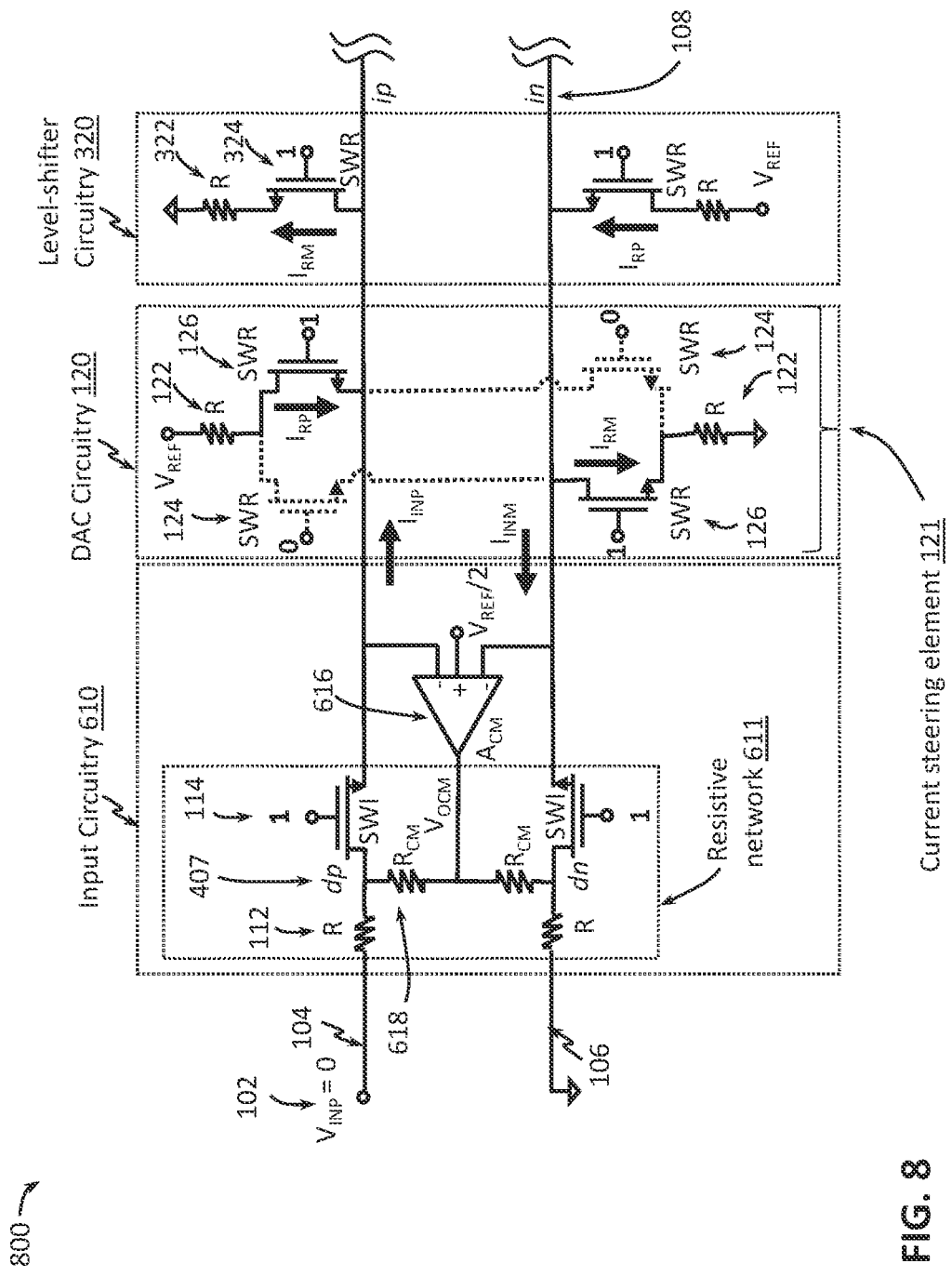
FIG. 8 is a schematic diagram illustrating an exemplary scenario of a low-noise, high-linearity single-ended CTSD modulator operating with a negative full-scale input, according to some embodiments of the present disclosure.

FIG. 8 is a schematic diagram illustrating a scenario 800 of the low-noise, high-linearity single-ended CTSD modulator 600 operating with a negative full-scale input, according to some embodiments of the present disclosure. For simplicity of illustration and discussion, FIG. 8 illustrates a portion of the CTSD modulator 600, for example, up to the level-shifter circuitry 320.

In the scenario 800, the input voltage $V_{INP}$ at the input node 102 on the signal path 104 may be at a voltage level of 0 V, and the voltage $V_{INM}$ at the input node 102 of the signal path 106 may be connected to a ground potential. Thus, the current injected by the input circuitry 610 along the signal path 104 represented by $I_{INP}$ and along the signal path 106 represented by $I_{INM}$ may be the same. Consequently, there is no differential current injected into the signal paths 104 and 106. The input circuitry 610 can inject common mode current into the signal paths 104 and 106, but any injected common mode current is canceled by the common mode amplifier $A_{CM}$ 616. For a negative full-scale input, the digital code generated by the quantizer circuitry 140 (not shown) may be 0 (e.g., D=0). Accordingly, at the DAC circuitry 120, the switches 124 (driven by D) may be opened (where the opened switches 124 and associated signal path are shown as dotted lines to represent no contribution to the circuitry) and the switches 126 (driven by $\overline{D}$) may be closed. At the top signal path 104, the current (represented by $I_{RP}$) from $V_{REF}$ at the current steering element 121 may flow through the level-shifter circuitry 320 shown by $I_{RM}$ into ground. In a similar way, at the bottom signal path 106, the current (represented by $I_{RP}$) from $V_{REF}$ at the level-shifter circuitry 320 may flow through the current steering element 121 shown by $I_{RM}$ into ground. That is, the feedback DAC circuitry 120 cancels current from the level-shifter circuitry 320. Hence, current at the nodes ip and in 108 (inputs to the integrator circuitry 130) is balanced and the CTSD modulator 600 is stable.

Figure 9:
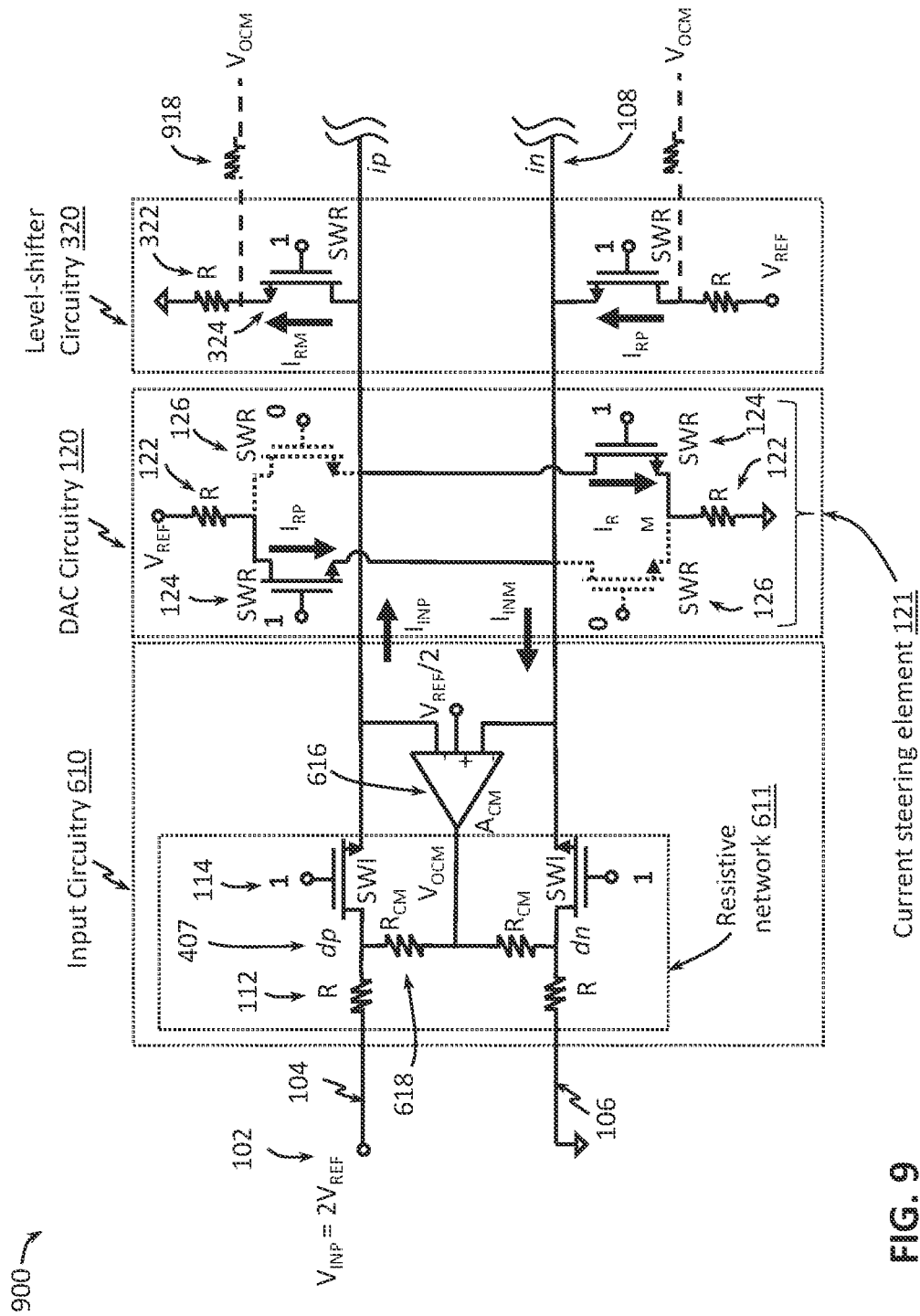
FIG. 9 is a schematic diagram illustrating an exemplary scenario of a low-noise, high-linearity single-ended CTSD modulator operating with a positive full-scale input, according to some embodiments of the present disclosure.

FIG. 9 is a schematic diagram illustrating a scenario 900 of the low-noise, high-linearity single-ended CTSD modulator operating with a positive full-scale input, according to some embodiments of the present disclosure. For simplicity of illustration and discussion, FIG. 9 illustrates a portion of the CTSD modulator 600, for example, up to the level-shifter circuitry 320.

In scenario 900, the input voltage $V_{INP}$ at the input node 102 on the signal path 104 may be at a voltage level of $2V_{REF}$, and the voltage $V_{INM}$ at the input node 102 on the signal path 106 may be connected to a ground potential. The digital code generated by the quantizer circuitry 140 (not shown) for the positive full-scale input may be 1 (e.g., D=1). Accordingly, at the feedback DAC circuitry 120, the switches 124 (driven by D) may be closed and the switches 126 (driven by $\overline{D}$) may be opened (where the opened switches 126 and associated signal path are shown as dotted lines to represent no contribution to the circuitry). To avoid a gain drift, the current (represented by $I_{INP}$) injected from input node 102 of the signal path 104 is to balance the current (represented by $I_{RM}$) flowing through the right leg of the current steering element 121 and the current (represented by $I_{RM}$) flowing through the resistor 322 and the switch 324 in level-shifter circuitry 320 shown on the top of FIG. 9. In a similar way, the current (represented by $I_{INM}$) injected from input node 102 of the signal path 106 is to balance the current (represented by $I_{RP}$) flowing through the left leg of the current steering element 121 and the current (represented by $I_{RP}$) flowing through the resistor 322 and the switch 324 in level-shifter circuitry 320 shown on the bottom of FIG. 9. Stated differently, the goal is to balance the differential current (e.g., $I_{INP}-I_{INM}$) injected from the input circuitry 610 (via the input resistors 112) and the sum of differential current (e.g., $2(I_{RP}-I_{RM})$) generated by the feedback DAC circuitry 120 for a digital code of 1 (e.g., D=1) and the level-shifter circuitry 320. That is, a gain drift can be avoided for a positive full-scale input if the following condition is satisfied:

$$(I_{INP}-I_{INM})=2(I_{RP}-I_{RM}). \quad (1)$$

As explained above, the common mode amplifier 616 may cause the voltages at the nodes ip and in 108 to be at $V_{REF}/2$. Thus, the sum of differential current $2(I_{RP}-I_{RM})$ contributed by the feedback DAC circuitry 120 and the level-shifter circuitry 320 may be expressed as shown below:

$$2(I_{RP}-I_{RM})=V_{REF}/(R+R_{SWR}), \quad (2)$$

where R may represent the resistance of the resistors 122 in the feedback DAC circuitry 120 and the resistance of the resistors 322 in level-shifter circuitry 320 and $R_{SWR}$ may represent the on-state resistance of the switches 124 in the feedback DAC circuitry 120 and the on-state resistance of the switches 324 in the level-shifter circuitry 320. The differential current ($I_{INP}-I_{INM}$) injected by the input circuitry 610 may be expressed as shown below:

$$(I_{INP}-I_{INM})=V_{REF}/(R+R_{SWT}+R\times R_{SWT}/R_{CM}), \quad (3)$$

where R may represent the resistance of the input resistors 112 in input circuitry 610, $R_{SWT}$ may represent the on-state resistance of the input switches 114 in the input circuitry 610, and $R_{CM}$ may represent the resistance of the resistors 618. In other words, the resistance of resistive elements (e.g., the input resistors 112, the input switches 114, and the common mode resistors 618) in the resistive network 611 is to match the resistance of the feedback DAC circuitry 120 and the level-shifter circuitry 320 to avoid a gain drift for a positive full-scale input (or positive full-scale codeword).

In some embodiments, to balance the current or to match the resistance between the input circuitry 610 and the combination of the DAC circuitry 120 and the level-shifter circuitry 320 as discussed above, the common mode resistors 618 can be sized such that the common mode resistors 618 may have a resistance that is half the resistance of each of the resistors 112, 122, 322, and the input switches 114 may be sized such that the input switches 114 may have an on-state resistance that is one-third of the on-state resistance of each of the switches 124, 126, 324 (e.g., each input switch 114 can be three times the size (dimensions) of each of the switches 124, 126, and 324).

In general, the differential current balancing condition shown in equation (1) can be satisfied in a variety of ways. For instance, in some embodiments, the CTSD modulator 600 can include additional common mode resistors to feed a fraction of the common mode current to the switches 324 of the level-shifter circuitry 320. For instance, in the CTSD modulator 600, the output of the common mode amplifier 316 may be coupled to each switch 324 of the level-shifter circuitry 320 (e.g., at a connection node between the switch 324 and a corresponding resistor 322) via a common mode resistor 918 (shown by the resistor in dashed lines). The additional common mode resistors 918 may be sized appropriately to provide a fully differential signal and avoid the gain drift, for example, based on the input signal levels. In other embodiments, the CTSD modulator 600 may utilize circuitry to provide a negative resistance (e.g., of $-2R_{cm}$) to counter offset the resistance introduced by the common mode resistors 618 instead of based on the sizing of the common mode resistors 618 and/or the input switches 114 and/or adding additional resistors as discussed above with reference to FIG. 9.

Figure 10:
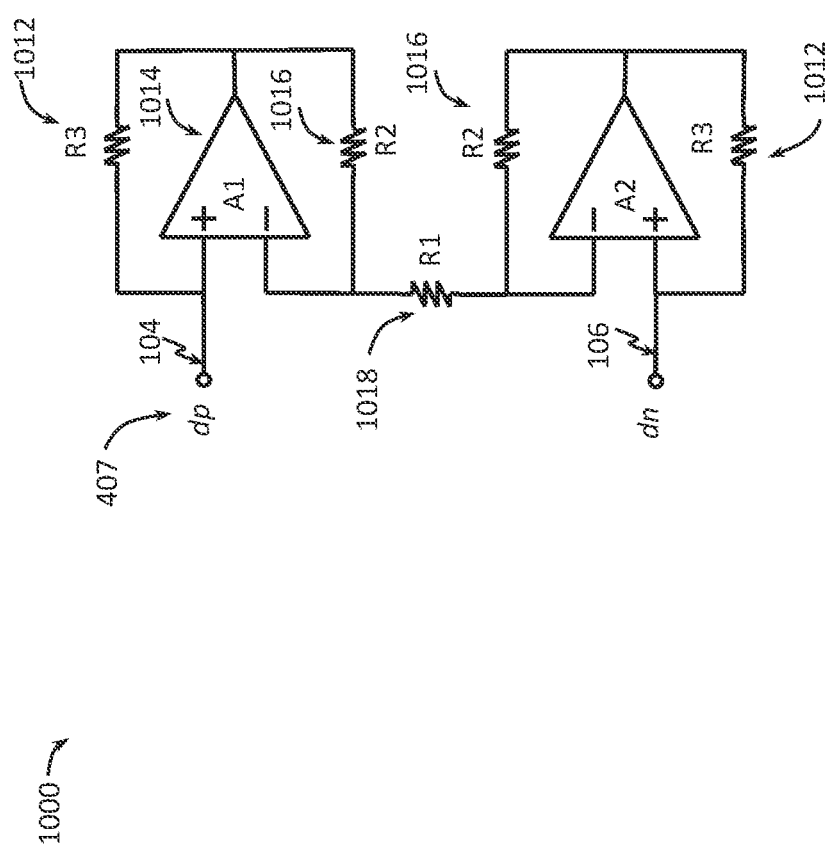
FIG. 10 is a schematic diagram illustrating an exemplary negative resistance circuitry, according to some embodiments of the present disclosure.

FIG. 10 is a schematic diagram illustrating an exemplary negative resistance circuitry 1000, according to some embodiments of the present disclosure. In some embodiments, the CTSD modulator 600 may further include the negative resistance circuitry 1000, for example, to mitigate the gain drift that may occur with a positive full-scale input as discussed above with reference to FIG. 9.

As shown, the negative resistance circuitry 1000 may include a pair of amplifiers 1014, each coupled to one of the signal paths 104 or 106. In this regard, the non-inverting input (shown by the "+" symbol) of the amplifier 1014 represented by A1 is coupled to the node dp 407 on the signal path 104 and the non-inverting input of the other amplifier 1014 represented by A2 is coupled to the node dn 407 on the signal path 106. The inverting inputs (shown by the "−" symbols) of the amplifiers 1014 are connected to each other via a resistor 1018 represented by R1. Further, the output of each amplifier 1014 is connected to the non-inverting input of the amplifier 1014 via a resistor 1012 represented by R3. Further still, the output of each amplifier 1014 is connected to the inverting input of the amplifier 1014 via a resistor 1016 represented by R2.

Referring to the CTSD modulator 600 shown in FIG. 6, a differential voltage across nodes dp and dn 407 may generate a differential current across the resistors 618. This differential current can cause the gain error or gain drift discussed above with reference to FIG. 9. The negative resistance circuitry 1000 may operate to reduce or substantially cancel this differential current at the nodes dp and dn 407, thus avoiding or reducing the gain error.

In general, the CTSD modulator 600 may utilize any suitable combination of negative resistance circuitry 1000, sizing of the common mode resistors 618 and/or the input switches 114 in the input circuitry 610, and/or adding additional common mode resistors 918 to feed a fraction of common mode current to the switches 324 of the level-shifter circuitry 320 to satisfy the differential current balancing condition discussed above with reference to equation (1) and FIG. 9.

Figure 11:
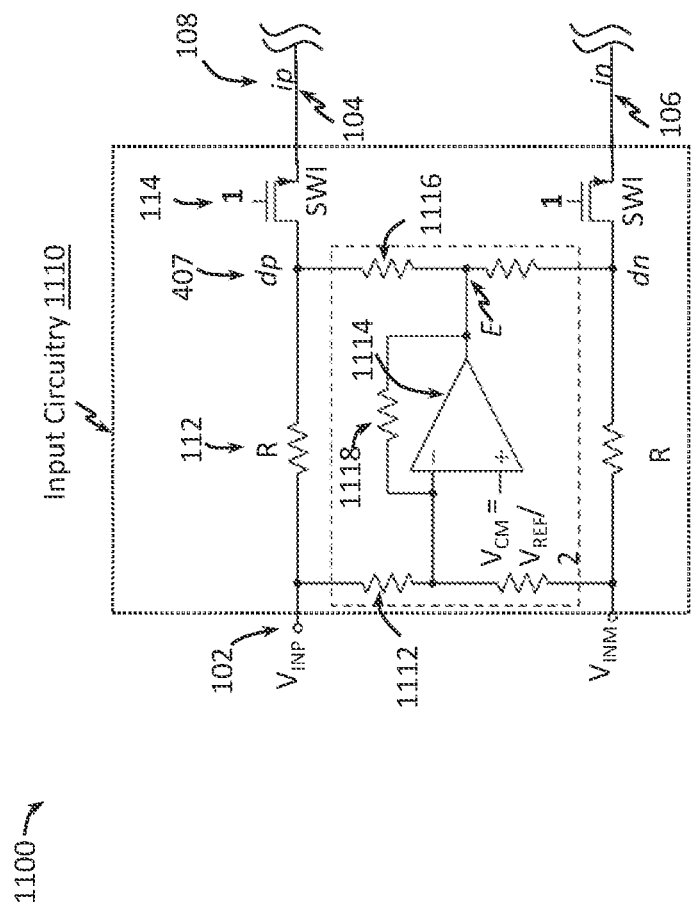
FIG. 11 is a schematic diagram illustrating an exemplary an exemplary single-ended CTSD modulator that utilizes a feedforward configuration to provide common mode current cancellation, according to some embodiments of the present disclosure.

FIG. 11 is a schematic diagram illustrating an exemplary single-ended CTSD modulator 1100 that utilizes a feedforward configuration to provide common mode current cancellation, according to some embodiments of the present disclosure. In some embodiments, the single-ended CTSD modulator 1100 may correspond to the CTSD modulator 210 in the CTSD ADC 200 of FIG. 2. For simplicity of illustration and discussion, FIG. 11 illustrates only the input stage of the CTSD modulator 1100. However, the CTSD modulator 1100 may include DAC circuitry 120, integrator circuitry 130, level-shifter circuitry 320, and quantizer circuitry 140 that are arranged and operate in substantially the same way as the CTSD modulators 300, 400, and 600 discussed above with reference to FIGS. 3, 4 and 6, respectively. For simplicity's sake, the same reference numerals are used for parts that are the same as the CTSD modulators 300, 400, and 600 discussed above.

As shown in FIG. 11, the input circuitry 1110 may include a pair of resistors 112 each coupled to one of the input nodes 102 on the signal paths 104 and 106 and a pair of switches 114 each coupled to one of the resistors 112. Similar to the CTSD modulators 300, 400, and 600, the CTSD modulator 1100 may receive a single-ended analog input signal at the input nodes 102. However, instead of providing a differential current using a feedback configuration (e.g., with the common mode amplifier 316 or 616) as in the CTSD modulators 300, 400, and 600, the input circuitry 1110 includes an amplifier 1114 connected in a feedforward configuration to provide common mode current cancellation. In this regard, the inverting input (shown by the "−" symbol) of the amplifier 1114 is connected to each of the input nodes 102 via a resistor 1112. The inverting input is further connected to the output of the amplifier 1114 via a resistor 1118. The non-inverting input (shown by the "+" symbol) of the amplifier 1114 is connected to a voltage rail set to a desired common mode voltage (e.g., at $V_{REF}/2$) at the nodes dp and dn 407. The output of the amplifier 1114 is connected to each of the nodes dp and dn 407 (upstream of the input switches 114) via a resistor 1116.

The input circuitry 1110 may generate a common mode voltage of the input nodes at its inverting input, through the resistive divider formed by resistors 1112. The amplifier 1114 may compare the generated common mode voltage of the input nodes to the desired common mode voltage $V_{REF}/2$ and inject a common mode current into the signal paths 104 and 106 based on the comparison. Similar to the input circuitry 410 in the CTSD modulator 400 of FIG. 4 and the input circuitry 610 in the CTSD modulator 600 of FIG. 6, the common mode current injected by the amplifier 1114 may cancel the common mode current generated by the inputs at the input nodes 102. The cancellation of the common mode current from the inputs provides a differential current at the nodes dp and dn 407 so that the differential current may flow through the input switches 114 and further process by circuitries such as the DAC circuitry 120, the integrator circuitry 130, the level-shifter circuitry 320, and quantizer circuitry 140. In some embodiments, the common mode signal component at the input nodes 102 and the common mode signal component at the nodes dp and dn 407 can be different. In such embodiments, the input circuitry 1110 may include additional components such as resistors and/or capacitors (e.g., a common mode filter) to modify the common mode component provided by the amplifier 1114, for example, to match the common mode component at the input nodes 102.

Figure 12:
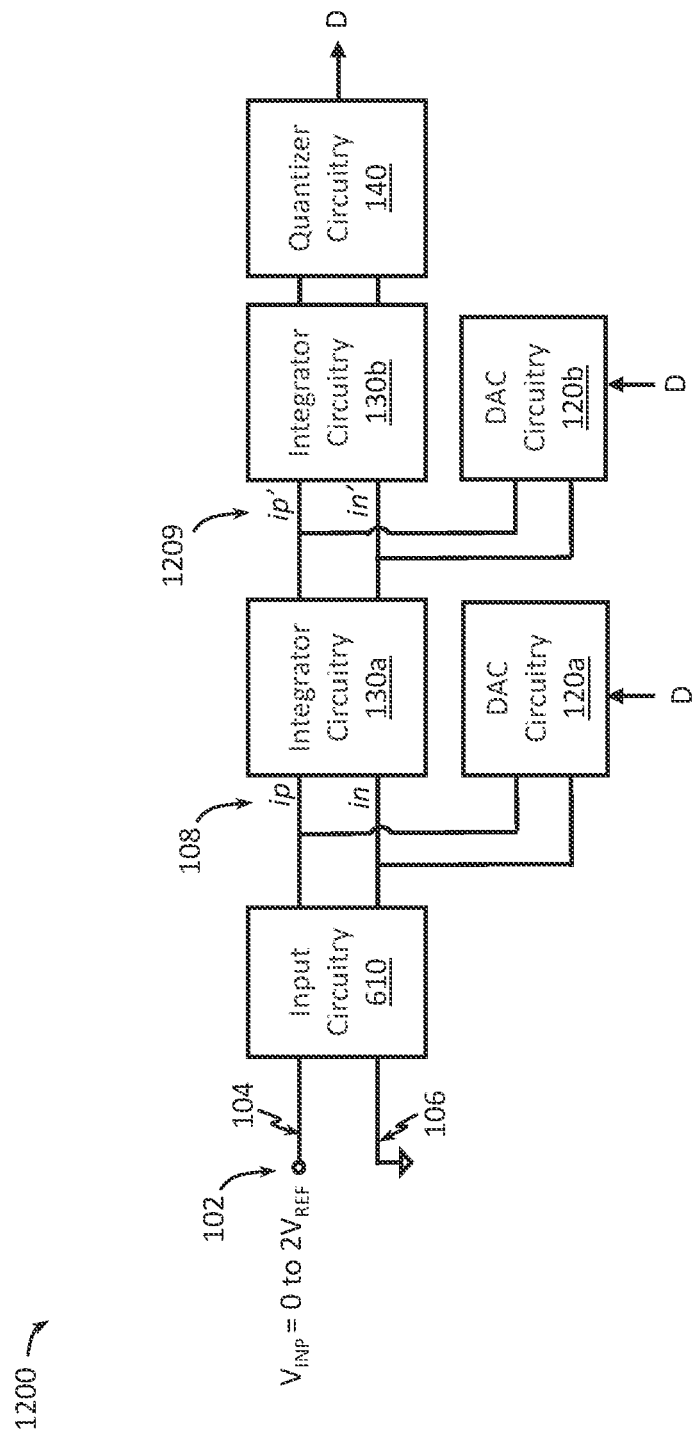
FIG. 12 is a schematic diagram illustrating an exemplary high-order single-ended CTSD modulator, according to some embodiments of the present disclosure.

FIG. 12 is a schematic diagram illustrating an exemplary high-order single-ended CTSD modulator 1200, according to some embodiments of the present disclosure. In some embodiments, the high-order single-ended CTSD modulator 1200 may correspond to the CTSD modulator 210 in the CTSD ADC 200 of FIG. 2. Generally speaking, the single-ended CTSD modulator 1200 may be similar to the CTSD modulator 600 in many respects. For example, the single-ended CTSD modulator 1200 shares the same circuitry including input circuitry 610, DAC circuitry 120, integrator circuitry 130, and quantizer circuitry 140 as the CTSD modulator 600 of FIG. 6. For brevity's sake, a discussion of these circuitries is not repeated, and these circuitries may take the form of any embodiments disclosed herein.

As shown in FIG. 12, the CTSD modulator 1200 includes multiple integrator circuitries 130 (shown as 130a and 130b) to provide a high-order (e.g., a second order) CTSD modulation and multiple corresponding DAC circuitries 120 (shown as 120a and 120b) to provide feedbacks to the integrator circuitries 130. More specifically, the CTSD modulator 1200 may include a first integrator circuitry 130a coupled to the input circuitry 610 and a first DAC circuitry 120a at the nodes ip and in 108. The CTSD modulator 1200 may further include a second integrator circuitry 130b coupled to the output of the first integrator circuitry 130a and a second DAC circuitry 120b at the nodes ip' and in' 1209. The quantizer circuitry 140 is coupled to the outputs of the second integrator circuitry 130b. In the illustrated example of FIG. 12, the quantizer circuitry 140 is a 1-bit ADC providing a 1-bit digital code (e.g., D) based on a comparison of the output of the second integrator circuitry 130 to a threshold as discussed above with reference to FIG. 1. The digital code D is then fed back to each of the first DAC circuitry 120a and the second DAC circuitry 120b. The first DAC circuitry 120a may generate a feedback current based on the digital code D as discussed above, and the first integrator circuitry 130a may integrate a sum of the feedback current and input current injected by the input circuitry 610 at nodes ip and in 108. In a similar way, the second DAC circuitry 120b may generate a feedback current based on the digital code D as discussed above, and the second integrator circuitry 130b may integrate a sum of the feedback current and output of the first integrator circuitry 130b at nodes ip' and in' 1209.

While the CTSD modulator 1200 is illustrated as a second order CTSD modulator using the input circuitry 610 of FIG. 6, aspects are not limited thereto. For instance, the CTSD modulator 1200 can be scaled to include any suitable number of integrator circuitries 130 (e.g., K number where K can be 2, 3, 4, or more) and corresponding DAC circuitries 120 to provide a K-th order CTSD modulator. Additionally or alternatively, the CTSD modulator 1200 may include an input stage that utilizes the input circuitry 410 of FIG. 4, the input circuitry 1110 (with the feedforward amplifier 1114) of FIG. 11, and/or the negative resistance circuitry 1000 of FIG. 10 in place of the input circuitry 610. Further, the CTSD modulator 1200 can include level-shifter circuitry similar to the level-shifter circuitry 320 to adjust the level of differential signals provided by the input circuitry 610 to fully differential signals as discussed above with reference to FIGS. 4 and 6.

Figure 13:
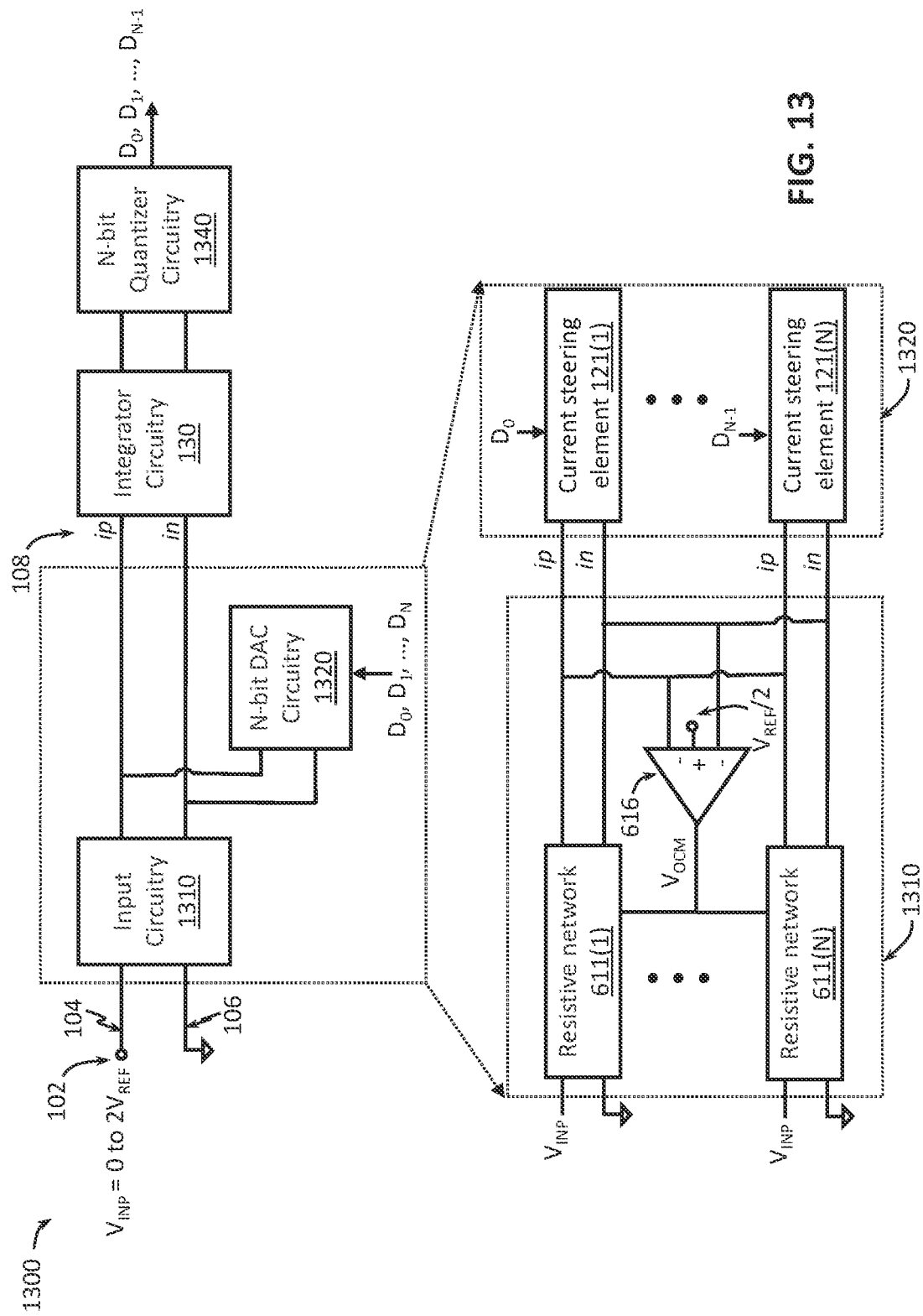
FIG. 13 is a schematic diagram illustrating an exemplary multi-bit single-ended CTSD modulator, according to some embodiments of the present disclosure.

FIG. 13 is a schematic diagram illustrating an exemplary multi-bit single-ended CTSD modulator 1300, according to some embodiments of the present disclosure. In some embodiments, the multi-bit single-ended CTSD modulator 1300 may correspond to the CTSD modulator 210 in the CTSD ADC 200 of FIG. 2. Generally speaking, the multi-bit single-ended CTSD modulator 1300 may be similar to the CTSD modulator 600 in many respects. For example, the multi-bit single-ended CTSD modulator 1300 shares the same circuitry including resistive network 611, current steering element 121, and integrator circuitry 130 as the CTSD modulator 600 of FIG. 6. For brevity's sake, a discussion of these circuitries is not repeated, and these circuitries may take the form of any embodiments disclosed herein.

As shown in FIG. 13, the CTSD modulator 1300 includes an input circuitry 1310, N-bit DAC circuitry 1320, integrator circuitry 130, and N-bit quantizer circuitry 1340. The input circuitry 1310 is coupled to a pair of input nodes 102 along the signal paths 104 and 106. At a high-level, the input circuitry 1310, the N-bit DAC circuitry 1320, the integrator circuitry 130, and the N-bit quantizer circuitry 1340 (e.g., N-bit ADC) may operate in substantially the same way as the CTSD modulator 600, but the N-bit quantizer circuitry 1340 may output a digital codeword including multiple bits (e.g., N bits where N may bit 2, 3, 4, 5, 6, 7, 8, 9, 10, 12, 13 or more), and the N-bit DAC circuitry 1320 may generate multiple feedback signals. For instance, the input circuitry 1310 may receive a single-ended signal (e.g., between 0 V to $2V_{REF}$) from the pair of input nodes 102 and inject differential signals into the pair of nodes ip and in 108. The N-bit DAC circuitry 1320 may generate multiple feedback signals, each according to a corresponding bit of a digital codeword output by the N-bit quantizer circuitry 1340. The digital codeword may have N bits represented by $D_0, D_1, \ldots, D_{N-1}$. The differential current signals output by the input circuitry 1310 may be combined with the feedback current signals from the N-bit DAC circuitry 1320 at the nodes ip and in 108. The integrator circuitry 130 may integrate the combined signal, and the N-bit quantizer circuitry 1340 may quantize the integrated signal into an N-bit digital codeword. In some embodiments, the N-bit quantizer circuitry 1340 may include N number of comparators similar to the comparator 142, each comparing the integrated signal to a different signal level corresponding to a certain bit in the digital codeword.

A more detailed view of the input circuitry 1310 and the N-bit DAC circuitry 1320 are shown at the bottom of FIG. 13. As shown, the input circuitry 1310 may include a plurality of resistive networks 611 (shown as 611(1) to 611(N)) connected in parallel. Each resistive network 611 may include input resistors 122, input switches 114, and common mode resistors 618 (arranged in a T-network configuration) coupled to the signal paths 104 and 106 as shown in FIG. 6. The input circuitry 1310 may further include a common mode amplifier 616 coupled to the plurality of resistive networks 611. The common mode amplifier 616 can be connected to each of the resistive networks 611 in a similar manner as shown in FIG. 6. For instance, the inverting inputs of the common mode amplifier 616 are connected to the nodes ip and in 108, the non-inverting input of the common mode amplifier 616 is connected to a voltage rail set to a target common mode voltage (e.g., $V_{REF}/2$) desired at the nodes ip and in 108, and the output (e.g., $V_{OCM}$) of the common mode amplifier 616 is connected to each resistive network 611 at the inputs of each switch 114 via a corresponding common mode resistor 618. The common mode amplifier 616 may inject a common mode current to each resistive network 611 (in front of each switch 114) to cancel out the common mode current injected from the input nodes 102, and thus providing a differential current.

The N-bit DAC circuitry 1320 may include a plurality of current steering elements 121 (shown as 121(1) to 121(N)) connected in parallel. Each current steering element 121 may be coupled to the nodes ip and in 108 and may generate a feedback current based on a corresponding bit of the digital codeword output by the N-bit quantizer circuitry 1340. As shown, the digital codeword may have N bits, $D_0, D_1, \ldots, D_{N-1}$. For instance, the current steering element 121(1) may generate a feedback current based on $D_0$, a current steering element 121(2) (not shown) may generate a feedback current based on $D_1$, and so on. The last current steering element 121(N) may generate a feedback current based on $D_{N-1}$. In some embodiments, a resistance of each resistive network 611 is based on a resistance of a corresponding current steering element 121. For instance, a resistance of the resistive network 611(1) is based on a resistance of the current steering element 121(1), and a resistance of the resistive network 611(N) is based on a resistance of the current steering element 121(2) (not shown), and so on.

While the input circuitry 1310 for the multi-bit single-ended CTSD modulator 1300 is illustrated using the common mode amplifier 616 in the feedback configuration, aspects are not limited thereto. For instance, the multi-bit single-ended CTSD modulator 1300 can utilize a feedforward configuration to provide common current injection as discussed above with reference to FIG. 11 and/or the negative resistance circuitry 1000 of FIG. 10 in the input stage. In some embodiments, the multi-bit single-ended CTSD modulator 1300 may also include level-shifter circuitries similar to the level-shifter circuitries 320 discussed above with reference to FIGS. 3, 4, 6, 8, and 9, for example, depending on the range of voltage levels spanned by $V_{INP}$. Further, in some embodiments, the techniques for implementing a single-ended CTSD modulator input stage described herein can be utilized to provide a multi-stage single-ended CTSD modulator. For example, a multi-stage single-ended CTSD modulator may have a multi-stage architecture as described in U.S. Pat. No. 9,178,529, titled "Multi-stage noise shaping analog-to-digital converter," which may be incorporated by reference. A beginning stage of the multi-stages may be similar to the CTSD modulator 400 or 600 discussed above with reference to FIG. 4 or FIG. 6, respectively. In general, the techniques for implementing a single-ended CTSD modulator input stage described herein can be utilized to provide a high-order, multi-bit, and/or multi-stage CTSD modulator or CTSD ADC. Furthermore, different stages of a multi-stage CTSD modulator or CTSD ADC can have different integration orders (e.g., first-order, second-order, third-order or higher order) and/or utilize different number of quantization levels (e.g., digital output codeword with 1-bit, 2-bit, 3-bits or more in length).

Figure 14:
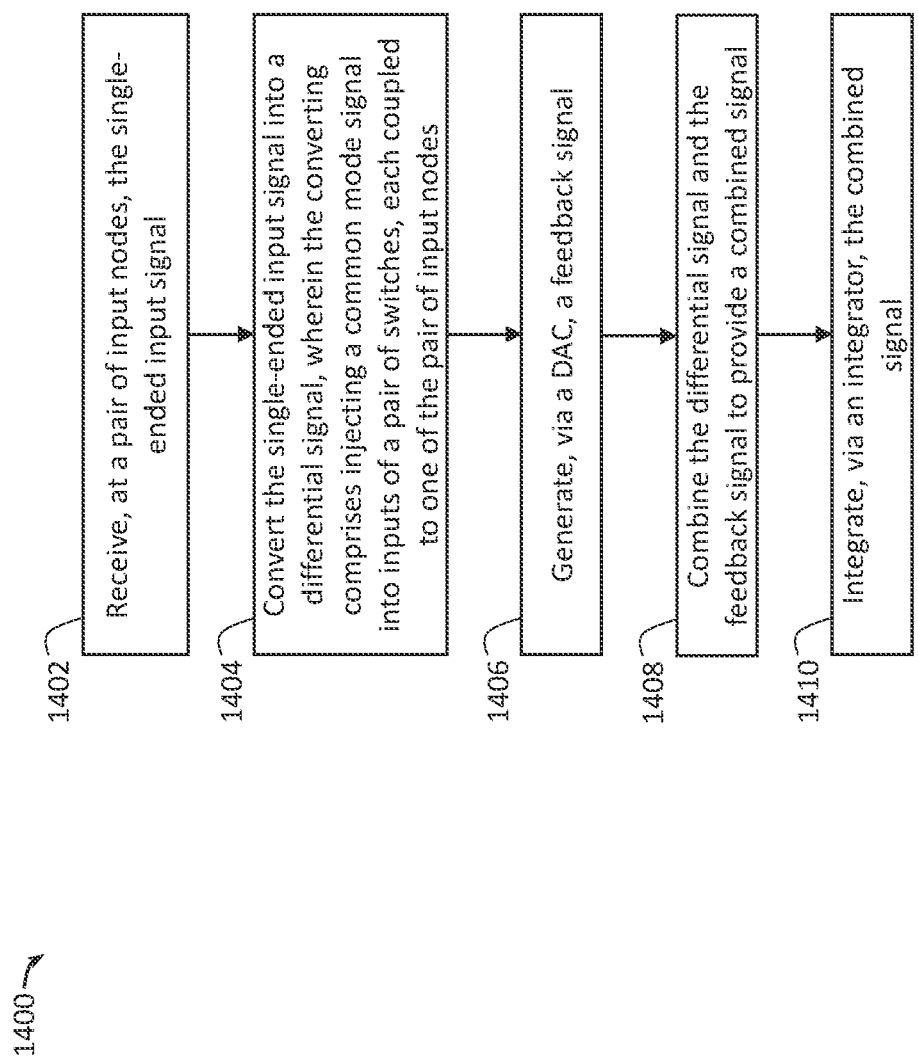
FIG. 14 is a flow diagram illustrating an exemplary method for providing low-noise, high-linearity single-ended CTSD analog-to-digital conversion, according to some embodiments of the present disclosure.

FIG. 14 is a flow diagram illustrating an exemplary method 1400 for providing low-noise, high-linearity single-ended CTSD analog-to-digital conversion, according to some embodiments of the present disclosure. The method 1400 can be implemented by the CTSD ADC 200, the single-ended CTSD modulator 400, the single-ended CTSD modulator 600, the high-order single-ended CTSD modulator 1200, and/or the multi-bit single-ended CTSD modulator 1300 or any suitable CTSD modulator or CTSD ADC that process single-ended input signals. The method 1400 may utilize similar mechanisms as discussed above with reference to FIGS. 1-13. Although the operations of the method 1400 may be illustrated with reference to particular embodiments of the CTSD modulators disclosed herein, the method 1400 may be performed using any suitable hardware components and/or software components. Operations are illustrated once each and in a particular order in FIG. 14, but the operations may be performed in parallel, reordered, and/or repeated as desired.

At 1402, a single-ended input signal is received at a pair of input nodes. The single-ended input signal may be a single-ended analog voltage signal. In some instances, the pair of input nodes may correspond to the input nodes 102 in the single-ended CTSD modulators 400, 600, 1100, 1200, and/or 1300 discussed above with reference to FIGS. 4, 6, 11, 12, and/or 13, respectively.

At 1404, the single-ended input signal is converted into a differential signal. As part of converting the single-ended input signal into the differential signal, a common mode signal is injected into a pair of switches, each coupled to one of the pair of input nodes. In other words, the common mode signal (e.g., common mode current) is injected at a pair of nodes (e.g., first nodes) that is before or upstream of the pair of switches. In some instances, the pair of switches may correspond to the input switches 114 and the first nodes may correspond to the pair of nodes dp and dn 407 in the single-ended CTSD modulators 400, 600, and/or 1100 discussed above with reference to FIGS. 4, 6, and/or 11, respectively.

In some instances, as part of injecting the common mode signal to the inputs of the pair of switches, a common mode amplifier may be used to generate the common mode signal based on signals at outputs of the pair of switches. In other words, the common mode amplifier may be configured in a feedback configuration as discussed above with reference to FIGS. 4-9 and 13. In some instances, the common mode amplifier may be similar to the common mode amplifier 316 discussed above with reference to FIGS. 3-5 in which the common mode amplifier may have two output terminals and each output terminal is directly connected to one of the first nodes. In other instances, the common mode amplifier may be similar to the common mode amplifier 616 discussed above with reference to FIGS. 6-9 and 13 in which the common mode amplifier may have a single output terminal connected to each of the pair of first nodes via a respective resistor similar to the common mode resistors 618. In yet other instances, as part of injecting the common mode signal to the inputs of the pair of switches, an operational amplifier may be used to generate the common mode signal based the input signal in a feedforward configuration as discussed above with reference to FIG. 11.

At 1406, a feedback signal is generated by a DAC. The DAC may be a current steering DAC, and the feedback signal may be a feedback current. In some instances, the DAC may correspond to the feedback DAC circuitry 120 in the single-ended CTSD modulators 400, 600, 1100, and/or 1200 discussed above with reference to FIGS. 4, 6, 11, and/or 12, respectively or the feedback DAC circuitry 1320 in the multi-bit single-ended CTSD modulator 1300 discussed above with reference to FIG. 13.

At 1408, the differential signal is combined with the feedback signal to provide a combined signal. For instance, the differential signal and the feedback signal may be summed at summing nodes similar to the pair of nodes ip and in 108 in the single-ended CTSD modulators 400, 600, 1100, and/or 1300 discussed above with reference to FIGS. 4, 6, 11, and/or 13, respectively, or the pair of nodes ip' and in' 1209 in the high-order single-ended CTSD modulator 1200 discussed above with reference to FIG. 12.

At 1410, the combined signal is integrated by an integrator. In some instances, the integrator may correspond to the integrator circuitry 130 in the single-ended CTSD modulators 400, 600, 1100, 1200, and/or 13 discussed above with reference to FIGS. 4, 6, 11, 12, and/or 13, respectively.

In some aspects, the method 1400 may further include shifting or adjusting a level of the combined signal before integrating the combined signal, for example, by using level-shifter circuitry similar to the level-shifter circuitry 320 to provide a fully differential signal to the integrator as discussed above with reference to FIGS. 3-9. In some instances, the level-shifting of the combined signal may be based on voltage levels of the single-ended input signal received at the pair of input nodes. For instance, if the positive input (e.g., $V_{INP}$) is at $2V_{REF}$, and the negative input ($V_{INM}$) is at $V_{REF}$, then the level-shifting may be skipped.

In some aspects, the single-ended CTSD modulator may include an input circuitry coupled to the pair of input nodes, where the input circuitry may include a resistive network (e.g., the resistive network 611). The resistive network may include a plurality of resistive elements including the pair of switches (e.g., input switches) at which the common mode current is injected. The method 1400 may further include sizing one or more of the plurality of resistive elements such that the amount of current flowing from the input circuitry into the second nodes for a full-scale input is substantially the same as the feedback current generated by the feedback DAC for a full-scale codeword. If the single-ended CTSD modulator includes level-shifter circuitry, the method 1400 may further include sizing one or more of the plurality of resistive elements such that the amount of current flowing from the input circuitry into the second nodes is substantially the same as the sum of feedback current generated by the feedback DAC for a full-scale codeword and the current provided by the level-shifter circuitry.

EXAMPLES

Example 1 is a single-ended continuous time sigma delta (CTSD) analog-to-digital converter (ADC) including a pair of input nodes to receive a single-ended input signal and input circuitry. The input circuitry includes a pair of switches, each coupled to one of the pair of input nodes; and an amplifier to provide a common mode signal at a pair of first nodes, each before one of the pair of switches. The CTSD ADC further includes digital-to-analog converter (DAC) circuitry; and integrator circuitry coupled to the input circuitry and the DAC circuitry via a pair of second nodes. The pair of first nodes cancels or subtracts the common mode signal from the single-ended input signal to provide a differential signal to the pair of switches. The DAC circuitry generates a feedback signal. The pair of second nodes combines the feedback signal with the differential signal to provide a combined signal. The integrator circuitry integrates the combined signal.

Example 2 includes the CTSD ADC of example 1, where the amplifier includes a first inverting input coupled to an output of one of the pair of switches; a second inverting input coupled to an output of the other one of the pair of switches; and a non-inverting input coupled to a voltage rail set to a target common mode voltage.

Example 3 includes the CTSD ADC of example 2, where the amplifier includes a first output and a second output, and where the amplifier is further to provide the common mode signal including a first common mode signal at the first output of the amplifier, the first output connected directly to one of the pair of first nodes; and a second common mode signal at the second output of the amplifier, the second output connected directly to the other one of the pair of first nodes.

Example 4 includes the CTSD ADC of example 3, where the first and second common mode signals are common mode current signals.

Example 5 includes the CTSD ADC of example 3, where the amplifier further includes three p-channel metal-oxide-semiconductor (PMOS) devices, each receiving one of the first inverting input, the second inverting input, and the non-inverting input; two n-channel metal-oxide-semiconductor (NMOS) devices operating with the three PMOS devices to provide a first voltage; and two other PMOS devices, each providing one of the first common mode signal and the second common mode signal based on the first voltage.

Example 6 includes the CTSD ADC of example 3, where the amplifier includes a single output, where the input circuitry further includes a pair of resistors, each connected between a corresponding one of the pair of first nodes and the single output of the amplifier.

Example 7 includes the CTSD ADC of example 6, where the amplifier further includes three p-channel metal-oxide-semiconductor (PMOS) devices each receiving one of the first inverting input, the second inverting input, and the non-inverting input; two n-channel metal-oxide-semiconductor (NMOS) devices operating with the three PMOS devices to provide a first voltage; and one other PMOS device providing a common mode voltage at the single output of the amplifier based on the first voltage, and where the amplifier provides the common mode signal to the pair of first nodes via the pair of resistors.

Example 8 includes the CTSD ADC of any of examples 1-7, where the common mode signal is a common mode current signal.

Example 9 includes the CTSD ADC of any of examples 1-8, where the input circuitry includes a resistive network including a plurality of resistive elements including the pair of switches, and where one or more of the plurality of resistive elements are sized to provide, for a full-scale input, a current flowing from the input circuitry into the pair of second nodes with an amount substantially the same as a feedback current generated by the DAC circuitry for a full-scale codeword.

Example 10 includes the CTSD ADC of any of examples 1-9, where the pair of switches are sized to provide, for a full-scale input, the current flowing from the input circuitry into the pair of second nodes with the amount substantially the same as the feedback current generated by the DAC circuitry for the full-scale codeword.

Example 11 includes the CTSD ADC of any of examples 1-10, where the DAC circuitry includes a third switch coupled to one of a reference voltage or a ground potential, and where each of the pair of switches in the input circuitry and the third switch in the DAC circuitry are metal-oxide-semiconductor (MOS) devices.

Example 12 includes the CTSD ADC of any of examples 1-11, further including level-shifter circuitry coupled to the second pair of nodes, where the input circuitry includes a resistive network including a plurality of resistive elements including the pair of switches, and where one or more of the plurality of resistive elements are sized to provide, for a full-scale input, a current flowing from the input circuitry into the pair of second nodes with an amount substantially the same as a sum of a feedback current generated by the DAC circuitry for a full-scale codeword and a current provided by the level-shifter circuitry.

Example 13 includes the CTSD ADC of any of examples 1-12, where the pair of switches are sized to provide the current flowing from the input circuitry into the pair of second nodes with the amount substantially the same as the sum of the feedback current generated by the DAC circuitry for the full-scale codeword and the current provided by the level-shifter circuitry.

Example 14 includes the CTSD ADC of any of examples 1-13, where the DAC circuitry includes a third switch coupled to one of a reference voltage or a ground potential, where the level-shifter circuitry includes a fourth switch coupled to one of the reference voltage or the ground potential, and where each of the pair of switches in the input circuitry, the third switch in the DAC circuitry, and the fourth switch in the level-shifter circuitry are metal-oxide-semiconductor (MOS) devices.

Example 15 includes the CTSD ADC of any of examples 1-14, where the input circuitry includes a resistive network including a plurality of resistive elements including the pair of switches, and where the CTSD ADC further includes negative resistance circuitry to provide a negative resistance based on a resistance of the resistive network in the input circuitry.

Example 16 includes the CTSD ADC of any of examples 1-15, where the negative resistance circuitry is coupled across the pair of first nodes.

Example 17 includes the CTSD ADC of any of examples 1-16, where the negative resistance circuitry includes a first amplifier having a non-inverting input coupled to one of the pair of first nodes; a first resistive network coupled to the first amplifier; a second amplifier having a non-inverting input coupled to the other one of the pair of first nodes; a second resistive network coupled to the second amplifier; and a resistor connected between an inverting input of the first amplifier and an inverting input of the second amplifier.

Example 18 includes the CTSD ADC of any of examples 1-17, further including level-shifter circuitry coupled to the second pair of nodes, the level-shifter circuitry including a first switch coupled to one of a reference voltage or a ground potential, where the input circuitry includes a resistive network including a plurality of resistive elements including the pair of switches, where an output of the amplifier is coupled to the first switch via a resistor, and where the resistor is sized to provide, for a full-scale input, a current flowing from the input circuitry into the pair of second nodes with an amount substantially the same as a sum of a feedback current generated by the DAC circuitry for a full-scale codeword and a current provided by the level-shifter circuitry.

Example 19 includes the CTSD ADC of any of examples 1-18, where the amplifier includes an inverting input coupled to the pair of input nodes; and a non-inverting input coupled to a voltage rail set to a target common mode voltage.

Example 20 includes the CTSD ADC of example 19, where the input circuitry further includes a first pair of resistors, each connected between one of the pair of input nodes and the inverting input of the amplifier; and a second pair of resistors, each connected between an output of the amplifier and one of the pair of first nodes.

Example 21 includes the CTSD ADC of any of examples 1-20, where the CTSD ADC is a multi-bit ADC, where the DAC circuitry includes at least a first current steering element connected in parallel with a second current steering element, where the input circuitry includes a first resistive network connected in parallel with a second resistive network, where a resistance of the first resistive network is based on a resistance of the first current steering element, and where a resistance of the second resistive network is based on a resistance of the second current steering element.

Example 22 is an input circuitry in an integrated single-ended continuous time sigma delta (CTSD) analog-to-digital converter (ADC) device, the input circuitry including a pair of input nodes to receive a single-ended input signal; a first signal path coupled to one of the pair of input nodes, the first signal path including a first resistor coupled to an input of a first switch via a first node; a second signal path coupled to the other one of the pair of input nodes, the second signal path including a second resistor coupled to an input of a second switch via a second node; and a common mode amplifier to inject a common mode current signal to the first node and the second node to provide a differential signal across the input of the first switch and the input of the second switch.

Example 23 includes the input circuitry of example 22, where the common mode amplifier includes a first inverting input coupled to an output of the first switch; a second inverting input coupled to an output of the second switch; and a non-inverting input coupled to a voltage rail set to a target common mode voltage.

Example 24 includes the input circuitry of example 23, where the common mode amplifier includes a first output and a second output, and where the common mode amplifier is further to provide the common mode current signal including a first common mode current signal at the first output of the common mode amplifier, the first output connected directly to the first node; and a second common mode current signal at the second output of the common mode amplifier, the second output connected directly to the second node.

Example 25 includes the input circuitry of example 23, where the common mode amplifier includes a single output, where the input circuitry further includes a third resistor connected between the first node and the single output of the common mode amplifier; and a fourth resistor connected between the second node and the single output of the common mode amplifier.

Example 26 is a method for performing a continuous time sigma delta (CTSD) analog-to-digital conversion on a single-ended input signal, the method including receiving, at a pair of input nodes, the single-ended input signal; converting the single-ended input signal into a differential signal, where the converting includes injecting a common mode signal into inputs of a pair of switches, each coupled to one of the pair of input nodes; generating, via a digital-to-analog-converter (DAC), a feedback signal; combining the differential signal and the feedback signal to provide a combined signal; and integrating, via an integrator, the combined signal.

Example 27 includes the method of example 26, where the injecting the common mode signal to the inputs of the pair of switches includes generating, via a common mode amplifier, the common mode signal based on signals at outputs of the pair of switches.

Example 28 includes the method of example 27, where the injecting the common mode signal to the inputs of the pair of switches further includes providing, via an amplifier, a common mode current signal to each input of the pair of switches via a respective resistor.

Example 29 includes the method of any of examples 26-29, further including shifting, via level-shifter circuitry, a level of the combined signal before integrating the combined signal.

VARIATIONS AND IMPLEMENTATIONS

While embodiments of the present disclosure were described above with references to exemplary implementations as shown in FIGS. 1-14, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as input circuitries, DAC circuitries, integrator circuitries, quantizer circuitries, level-shifter circuitries, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to single-ended sigma-delta ADCs, in various communication, medical, audio, video, and/or industrial systems.

Parts of various systems for implementing input stages for single-ended sigma-delta modulators as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the sigma-delta modulators and/or circuitries shown in FIGS. 1-13) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

It is also important to note that the optimization functions, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:

1. A single-ended continuous time sigma delta (CTSD) analog-to-digital converter (ADC) comprising:
    a pair of input nodes to receive a single-ended input signal;
    input circuitry comprising:
        a pair of switches, each coupled to one of the pair of input nodes; and
        an amplifier to provide a common mode signal at a pair of first nodes, each before one of the pair of switches;
    digital-to-analog converter (DAC) circuitry; and
    integrator circuitry coupled to the input circuitry and the DAC circuitry via a pair of second nodes.

2. The CTSD ADC of claim 1, wherein the amplifier comprises:
    a first inverting input coupled to an output of one of the pair of switches;
    a second inverting input coupled to an output of the other one of the pair of switches; and
    a non-inverting input coupled to a voltage rail set to a target common mode voltage.

3. The CTSD ADC of claim 2, wherein the amplifier comprises a first output and a second output, and wherein the amplifier is further to provide the common mode signal including:
    a first common mode signal at the first output of the amplifier, the first output connected directly to one of the pair of first nodes; and
    a second common mode signal at the second output of the amplifier, the second output connected directly to the other one of the pair of first nodes.

4. The CTSD ADC of claim 2, wherein the amplifier comprises a single output, wherein the input circuitry further comprises
    a pair of resistors, each connected between a corresponding one of the pair of first nodes and the single output of the amplifier.

5. The CTSD ADC of claim 1, wherein the input circuitry comprises a resistive network comprising a plurality of resistive elements including the pair of switches, and wherein one or more of the plurality of resistive elements are sized to provide, for a full-scale input, a current flowing from the input circuitry into the pair of second nodes with an amount substantially the same as a feedback current generated by the DAC circuitry for a full-scale codeword.

6. The CTSD ADC of claim 5, wherein the pair of switches are sized to provide, for a full-scale input, the current flowing from the input circuitry into the pair of second nodes with the amount substantially the same as the feedback current generated by the DAC circuitry for the full-scale codeword.

7. The CTSD ADC of claim 1, further comprising:
    level-shifter circuitry coupled to the pair of second nodes,
    wherein the input circuitry comprises a resistive network comprising a plurality of resistive elements including the pair of switches, and
    wherein one or more of the plurality of resistive elements are sized to provide, for a full-scale input, a current flowing from the input circuitry into the pair of second nodes with an amount substantially the same as a sum of a feedback current generated by the DAC circuitry for a full-scale codeword and a current provided by the level-shifter circuitry.

8. The CTSD ADC of claim 7, wherein the pair of switches are sized to provide the current flowing from the input circuitry into the pair of second nodes with the amount substantially the same as the sum of the feedback current generated by the DAC circuitry for the full-scale codeword and the current provided by the level-shifter circuitry.

9. The CTSD ADC of claim 1, wherein the input circuitry comprises a resistive network comprising a plurality of resistive elements including the pair of switches, and wherein the CTSD ADC further comprises:
    negative resistance circuitry to provide a negative resistance based on a resistance of the resistive network in the input circuitry.

10. The CTSD ADC of claim 1, further comprising:
    level-shifter circuitry coupled to the pair of second nodes, the level-shifter circuitry comprising a first switch and a first resistor coupled to one of a reference voltage or a ground potential,
    wherein the input circuitry comprises a resistive network comprising a plurality of resistive elements including the pair of switches,
    wherein an output of the amplifier is coupled to the first switch via a second resistor, and
    wherein the second resistor is sized to provide, for a full-scale input, a current flowing from the input circuitry into the pair of second nodes with an amount substantially the same as a sum of a feedback current generated by the DAC circuitry for a full-scale codeword and a current provided by the level-shifter circuitry.

11. The CTSD ADC of claim 1, wherein the amplifier comprises:
    an inverting input coupled to the pair of input nodes; and
    a non-inverting input coupled to a voltage rail set to a target common mode voltage.

12. The CTSD ADC of claim 1, wherein the CTSD ADC is a multi-bit ADC, wherein the DAC circuitry comprises at least a first current steering element connected in parallel with a second current steering element, wherein the input circuitry comprises a first resistive network connected in parallel with a second resistive network, wherein a resistance of the first resistive network is based on a resistance of the first current steering element, and wherein a resistance of the second resistive network is based on a resistance of the second current steering element.

13. An input circuitry in an integrated single-ended continuous time sigma delta (CTSD) analog-to-digital converter (ADC) device, the input circuitry comprising:
- a pair of input nodes to receive a single-ended input signal;
- a first signal path coupled to one of the pair of input nodes, the first signal path comprising a first resistor coupled to an input of a first switch via a first node;
- a second signal path coupled to the other one of the pair of input nodes, the second signal path comprising a second resistor coupled to an input of a second switch via a second node; and
- a common mode amplifier to inject a common mode current signal to the first node and the second node to provide a differential signal across the input of the first switch and the input of the second switch.

14. The input circuitry of claim 13, wherein the common mode amplifier comprises:
- a first inverting input coupled to an output of the first switch;
- a second inverting input coupled to an output of the second switch; and
- a non-inverting input coupled to a voltage rail set to a target common mode voltage.

15. The input circuitry of claim 14, wherein the common mode amplifier comprises a first output and a second output, and wherein the common mode amplifier is further to provide the common mode current signal including:
- a first common mode current signal at the first output of the common mode amplifier, the first output connected directly to the first node; and
- a second common mode current signal at the second output of the common mode amplifier, the second output connected directly to the second node.

16. The input circuitry of claim 14, wherein the common mode amplifier comprises a single output, wherein the input circuitry further comprises
- a third resistor connected between the first node and the single output of the common mode amplifier; and
- a fourth resistor connected between the second node and the single output of the common mode amplifier.

17. A method for performing a continuous time sigma delta (CTSD) analog-to-digital conversion on a single-ended input signal, the method comprising:
- receiving, at a pair of input nodes, the single-ended input signal;
- converting the single-ended input signal into a differential signal, wherein the converting comprises injecting a common mode signal into inputs of a pair of switches, each coupled to one of the pair of input nodes;
- generating, via a digital-to-analog-converter (DAC), a feedback signal;
- combining the differential signal and the feedback signal to provide a combined signal; and
- integrating, via an integrator, the combined signal.

18. The method of claim 17, wherein the injecting the common mode signal to the inputs of the pair of switches comprises:
- generating, via a common mode amplifier, the common mode signal based on signals at outputs of the pair of switches.

19. The method of claim 18, wherein the injecting the common mode signal to the inputs of the pair of switches further comprises:
- providing, via an amplifier, a common mode current signal to each input of the pair of switches via a respective resistor.

20. The method of claim 17, further comprising:
shifting, via level-shifter circuitry, a level of the combined signal before integrating the combined signal.

* * * * *